(12) United States Patent
Yamashita et al.

(10) Patent No.: US 7,397,639 B2
(45) Date of Patent: Jul. 8, 2008

(54) MAGNETIC DETECTING ELEMENT PROVIDED WITH FREE LAYER HAVING LAYERED-FERRI CONFIGURATION

(75) Inventors: Tomohiro Yamashita, Niigaka-ken (JP); Naoya Hasegawa, Niigaka-ken (JP); Eiji Umetsu, Niigaka-ken (JP); Ryo Nakabayashi, Niigaka-ken (JP); Akira Takahashi, Niigaka-ken (JP)

(73) Assignee: TDK Corporation, Tokyo (JP)

( * ) Notice: Subject to any disclaimer, the term of this patent is extended or adjusted under 35 U.S.C. 154(b) by 371 days.

(21) Appl. No.: 11/194,090

(22) Filed: Jul. 28, 2005

(65) Prior Publication Data

US 2006/0028775 A1   Feb. 9, 2006

(30) Foreign Application Priority Data

Aug. 5, 2004   (JP)   ............................. 2004-229740

(51) Int. Cl.
*G11B 5/39* (2006.01)
(52) U.S. Cl. .............................. 360/324.12; 360/324.11
(58) Field of Classification Search .............. 360/324.1, 360/324.11, 324.12, 324.2
See application file for complete search history.

(56) References Cited

U.S. PATENT DOCUMENTS

| | | | |
|---|---|---|---|
| 6,538,858 B1 | 3/2003 | Hasegawa et al. | |
| 6,586,121 B2 | 7/2003 | Ide et al. | |
| 2004/0023075 A1* | 2/2004 | Saito et al. | ........... 428/694 MM |
| 2004/0052009 A1* | 3/2004 | Ohtsu et al. | ............. 360/324.12 |
| 2004/0141261 A1* | 7/2004 | Hasegawa et al. | ....... 360/324.11 |
| 2005/0073777 A1* | 4/2005 | Hasegawa et al. | ........... 360/321 |

* cited by examiner

*Primary Examiner*—Jefferson Evans
(74) *Attorney, Agent, or Firm*—Brinks Hofer Gilson & Lione

(57) ABSTRACT

A magnetic detecting element, which can suppress change in output asymmetry even if the magnetization direction of a pinned magnetic layer is changed 180°, is provided. The magnetic-film-thickness of a second free magnetic layer is increased so as to be greater than that of a first free magnetic layer and offset the torque applied to the second free magnetic layer with that applied to the first free magnetic layer when the sensing current magnetic field occurs. Thus, change in the magnetization direction of the free magnetic layer before and after a sensing current is applied in the magnetic detecting element can be suppressed. The orthogonal state between the free magnetic layer and the pinned magnetic layer is maintained even when a sensing current in the same direction as that before the occurrence is applied in the magnetic detecting element wherein pin inversion occurred, and the output asymmetry is maintained suitably.

12 Claims, 10 Drawing Sheets

FIG. 16
FIG. 15B
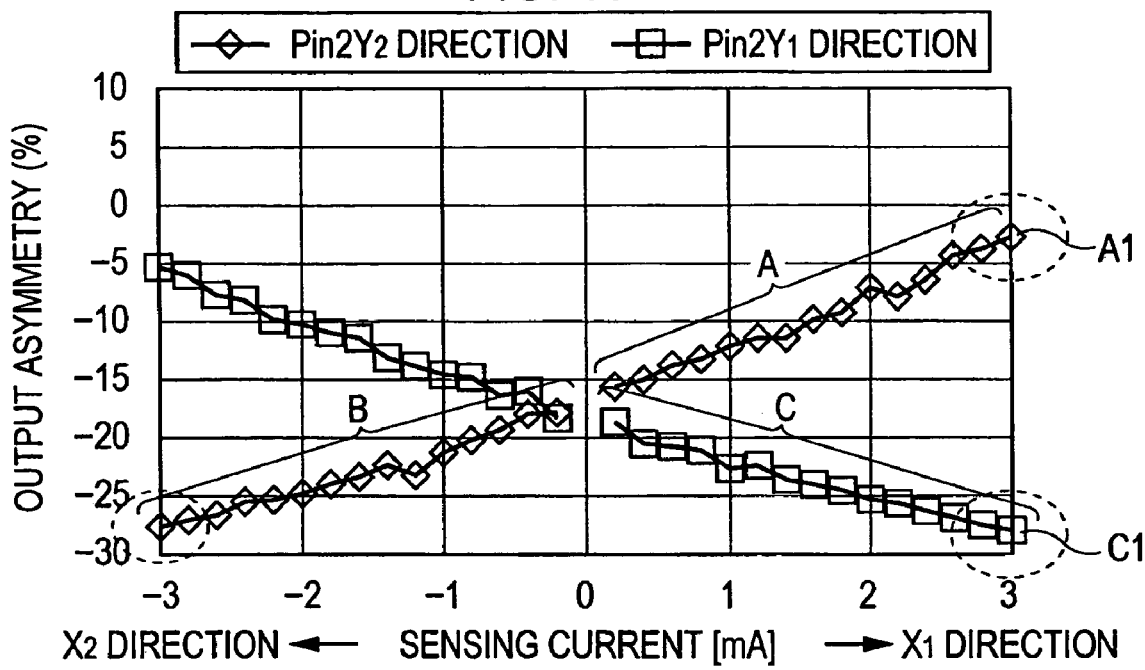
FIG. 17
FIG. 15B
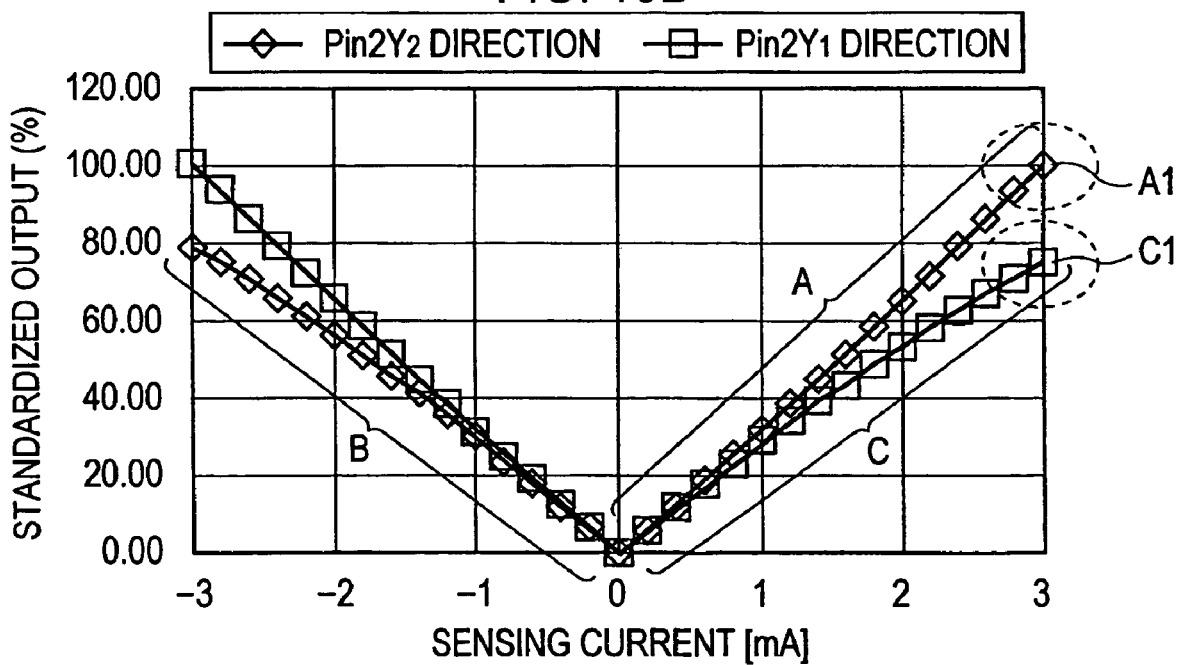

MAGNETIC DETECTING ELEMENT PROVIDED WITH FREE LAYER HAVING LAYERED-FERRI CONFIGURATION

This application claims the benefit of priority to Japanese Patent Application No. 2004-229740 filed on Aug. 5, 2004, herein incorporated by reference.

BACKGROUND OF THE INVENTION

1. Field of the Invention

The present invention relates to a magnetic detecting element having a free magnetic layer, a nonmagnetic material layer, and a pinned magnetic layer, and especially relates to a magnetic detecting element which facilitates uniform output symmetry.

2. Description of the Related Art

The current mainstream of magnetic heads mounted on a magnetic recording/reproducing device is a magnetic head which employs a spin-valve magnetic detecting element to which the Giant Magnetoresistive (GMR) effect is applied.

A spin-valve magnetic detecting element is an element wherein a ferromagnetic film called a pinned magnetic layer and a ferromagnetic soft magnetic film called a free magnetic layer are layered with a nonmagnetic film, called a nonmagnetic material layer, situated therebetween.

The magnetization of a free magnetic layer is aligned in one direction due to the vertical bias magnetic field from a hard bias layer made up of a soft magnetic member or the like. The magnetization of a free magnetic layer fluctuates sensitively as to the external magnetic field from a recording medium. On the other hand, the magnetization of the above pinned magnetic layer is pinned in the direction crossing the magnetization direction of the above free magnetic layer.

Electrical resistance varies depending on the relation between fluctuation in the magnetization direction of a free magnetic layer and the pinned magnetization direction of a pinned magnetic layer, and the leakage magnetic field from a recording medium is detected by voltage variation or current variation based on variation of this electrical resistance value.

Heretofore, the magnetization of the above pinned magnetic layer is pinned by forming the above pinned magnetic layer so as to be overlaid on an antiferromagnetic layer made up of an antiferromagnetic material, and causing the exchange coupling magnetic field between the above pinned magnetic layer and the above antiferromagnetic layer.

In recent years, as shown in FIG. 12, the magnetic detecting element H10 wherein an antiferromagnetic layer is omitted, and the magnetization of a pinned magnetic layer is pinned by uniaxial anisotropy of the pinned magnetic layer itself, has been proposed.

With the magnetic detecting element H10 shown in FIG. 12, a pinned magnetic layer 3 having a layered-ferri configuration wherein an underlying layer 2, a first pinned magnetic layer 3a, and a second pinned magnetic layer 3c are layered in this bottom-up order with a nonmagnetic intermediate layer 3b situated therebetween which is made up of an insulating material such as alumina, a nonmagnetic material layer 4, a free magnetic layer 5, and on the both sides 7 of a multi-layer film T made up of a protective layer 6, bias underlying layers 8, hard bias layers 9, and electrode layers 10 are formed.

With the magnetic detecting element H10 shown in FIG. 12, an antiferromagnetic layer overlaid on the pinned magnetic layer 3 is not formed, the magnetization of the first pinned magnetic layer 3a is pinned in the height direction (Y1 direction in the drawing) by uniaxial anisotropy of the pinned magnetic layer 3 itself, and the magnetization of the second pinned magnetic layer 3c is pinned in the direction opposite to the height direction (Y2 direction in the drawing). Also, the magnetization direction of the above free magnetic layer 5 is aligned in the track-width direction (X1-X2 direction in the drawing) orthogonal to the height direction (Y1 direction in the drawing).

With the magnetic detecting element H10 shown in FIG. 12, an antiferromagnetic layer having a great film thickness is not formed, so a shunt loss can be reduced as compared to the conventional magnetic detecting element having an antiferromagnetic layer, and accordingly, magnetic field detection output of the magnetic detecting element H10 can be improved up to 20 through 30%. Also, the distance between shield layers provided on the top and bottom of the magnetic detecting element H10 becomes short, so further increase of recording density of a recording medium can be handled.

The magnetic detecting element H10 such as shown in FIG. 12 is described in Japanese Unexamined Patent Application Publication No. 2000-113418 (Pages 7 and 8, FIGS. 4 through 7).

FIG. 13A is a partial cross-sectional view of the free magnetic layer 5, nonmagnetic material layer 4, and second pinned magnetic layer 3c of the magnetic detecting element shown in FIG. 12, and FIG. 13B is a schematic diagram illustrating a state, as viewed from the upper side of FIG. 13A, of the magnetization direction of the free magnetic layer 5 (arrow direction shown as Free) and the magnetization direction of the second pinned magnetic layer 3c (arrow direction shown as Pin2) before a sensing current is applied.

A sensing current flows centered on the nonmagnetic material layer having the lowest resistance value, so upon the sensing current flowing in the X1 direction shown in FIGS. 13A and 13B, the sensing current magnetic field Hb in the direction opposite to the height direction (Y2 direction in the drawing) is applied to the free magnetic layer 5 above the nonmagnetic material layer 4, and the sensing current magnetic field in the height direction (Y1 direction in the drawing) is applied to the second pinned magnetic layer 3c below the nonmagnetic material layer 4.

The magnetization direction of the second pinned magnetic layer 3c is preferably orthogonal to the magnetization direction of the free magnetic layer 5 in a state wherein the external magnetic field is not applied, since this can reduce the output asymmetry of the magnetic detecting element to 0%. Here, the term "output asymmetry" means a degree of asymmetry regarding a reproduced output waveform. In the event of giving a reproduced waveform, the output asymmetry is reduced when the waveform on the plus side is symmetrical to that on the minus side. Accordingly, the closer to 0% the output asymmetry comes, the more excellent the reproduced waveform thereof is regarding symmetry.

To this end, according to the conventional way as shown in FIG. 13B, the free magnetic layer 5 is put into a single magnetic domain state by the bias magnetic field from the hard bias layer, following which the magnetization direction of the free magnetic layer in a state prior to a sensing current being applied is rotated in the height direction (Y1 direction in the drawing) so as to apply the magnetostatic field from the pinned magnetic layer to the free magnetic layer 5.

As described above, upon a sensing current flowing in the X1 direction in the drawing following the magnetization direction of the free magnetic layer 5 being set, adjustment can be made so as to rotate the magnetization direction of the free magnetic layer 5 in the Y2 direction in the drawing by the sensing current magnetic filed Hb to cause the magnetization direction of the free magnetic layer 5 to be orthogonal to the magnetization direction of the second pinned magnetic layer 3c, thereby improving the output symmetry.

Now, a partial cross-sectional view of the free magnetic layer 5, nonmagnetic material layer 4, and second pinned magnetic layer 3c in a state wherein the direction of a sensing current to be applied to the magnetic detecting element shown in FIG. 12 is changed to the opposite direction thereof (X2 direction in the drawing), is shown in FIG. 14A. The state as viewed from the upper side of FIG. 14A, of the magnetization direction of the free magnetic layer 5 (arrow direction shown as Free) and the magnetization direction of the second pinned magnetic layer 3c (arrow direction shown as Pin2) before a sensing current is applied, is the same as that in FIG. 13B, with the schematic diagram thereof shown in FIG. 14B.

Upon the magnetization directions of the free magnetic layer 5 and the second pinned magnetic layer 3c being set to the same direction, and a sensing current flowing in the X2 direction in the drawing, the magnetization direction of the free magnetic layer 5 is rotated in the Y1 direction in the drawing by the sensing current magnetic field Hb, the angle between the magnetization direction of the second pinned magnetic layer 3c and the magnetization direction of the free magnetic layer 5 becomes greater, and comes farther away from an orthogonal state, resulting in deterioration of the output symmetry.

The test results are shown in FIG. 16 regarding change in the output asymmetry of the magnetic detecting element when the direction and magnitude of a sensing current to be applied to the magnetic detecting element shown in FIG. 12 are changed. The horizontal axis in FIG. 16 denotes the direction and magnitude of a sensing current. The X1 direction in the drawing is taken as the plus side, and the X2 direction in the drawing is taken as the minus side.

As shown in FIG. 13, upon a sensing current being applied in the X1 direction in the drawing (plus side), the magnetization direction of the free magnetic layer 5 is rotated in the Y2 direction in the drawing by the sensing current magnetic field Hb. As shown in FIG. 16A, the greater the value of the sensing current becomes, the closer to 90 degrees the angle between the magnetization direction of the free magnetic layer 5 and the magnetization direction of the second pinned magnetic layer 3c (Pin2) comes, accompanied thereby, the output asymmetry of the magnetic detecting element comes closer to 0%. In the case of this magnetic detecting element, upon a sensing current of 3 mA being applied in the X1 direction (plus direction), the output asymmetry becomes around −3%.

On the other hand, as shown in FIG. 14, upon a sensing current being applied in the X2 direction in the drawing (minus side), the magnetization direction of the free magnetic layer 5 is rotated in the Y1 direction in the drawing by the sensing current magnetic field Hb. As shown in FIG. 16B, the greater the absolute value of the sensing current becomes, the farther away from an orthogonal state the angle between the magnetization direction of the free magnetic layer 5 and the magnetization direction of the second pinned magnetic layer 3c (Pin2) comes, the greater the absolute value of the output asymmetry of the magnetic detecting element becomes. In the case of this magnetic detecting element, upon a sensing current of 3 mA being applied in the X2 direction (minus direction), the output asymmetry deteriorates to around −28%.

Here, with the magnetic detecting element H10 such as shown in FIG. 12, the following problems occur.

Generally, stress extending in the height direction shown in FIG. 12 (Y1 direction in the drawing) is applied to the magnetic detecting element. The first pinned magnetic layer 3a and the second pinned magnetic layer 3c in the pinned magnetic layer 3 are adjusted so as to exhibit positive magnetostriction, so according to a negative magnetostriction effect due to stress extending in the height direction (Y1 direction in the drawing), the first pinned magnetic layer 3a and the second pinned magnetic layer 3c are nonparallel to each other, and the magnetization thereof faces the height direction (Y1 direction in the drawing).

If we say that the magnetization in the pinned magnetic layer 3 is the sum of the magnetization moment of the first pinned magnetic layer 3a and the magnetization moment of the second pinned magnetic layer 3c, and the magnetization direction thereof is the height direction (Y1 direction in the drawing), in the event that external force is applied from the facing surface F10 side as to the recording medium of the magnetic detecting element H10, the magnetic detecting element H10 shrinks in the height direction (Y1 direction in the drawing), i.e., extends in the track-width direction (X1-X2 direction in the drawing) serving as the direction orthogonal to the height direction, and accordingly, the magnetization direction of the pinned magnetic layer 3 is also rotated in the track-width direction (X1-X2 direction in the drawing).

Thus, following the magnetization direction of the pinned magnetic layer 3 rotating from the height direction (Y1 direction in the drawing) to the track-width direction (X1-X2 direction in the drawing), upon the external force applied from the facing surface F10 as to the recording medium being removed, the magnetic detecting element H10 extends in the height direction (Y1 direction in the drawing) again, so the magnetization direction of the pinned magnetic layer 3 rotates in the direction orthogonal to the track-width direction (X1-X2 direction in the drawing) again, but at this time both the case in which the magnetization direction of the pinned magnetic layer 3 faces the height direction (Y1 direction in the drawing) and the case in which the magnetization direction of the pinned magnetic layer 3 faces the direction opposite to the height direction (Y2 direction in the drawing) occur with the same probability.

Accordingly, with the magnetic detecting element H10 shown in FIG. 12, following the external force being applied from the facing surface F10 as to the recording medium, upon this external force being removed, a problem called "pin inversion" readily occurs wherein the magnetization direction of the pinned magnetic layer 3 pinned in the height direction (Y1 direction in the drawing) rotates 180 degrees, i.e., the magnetization direction of the second pinned magnetic layer 3c faces the height direction, and the magnetization direction of the first pinned magnetic layer 3a faces the direction opposite to the height direction.

A partial cross-sectional view of the free magnetic layer 5, nonmagnetic material layer 4, and second pinned magnetic layer 3c when the magnetic detecting element H10 shown in FIG. 12 causes the pin inversion is shown in FIG. 15A. FIG. 15B is a schematic diagram illustrating a state, as viewed from the upper side of FIG. 15A, of the magnetization direction of the free magnetic layer 5 (arrow direction shown as Free) and the magnetization direction of the second pinned magnetic layer 3c (arrow direction shown as Pin2) before a sensing current is applied.

Upon the pin inversion occurring, the magnetization directions of the first pinned magnetic layer 3a and the second pinned magnetic layer 3c are inverted 180 degrees from the state shown in FIG. 13, so the direction of the magnetostatic field applied to the free magnetic layer from the pinned magnetic layer 3 is also inverted. As a result of this, as shown in FIG. 15B, the magnetization direction of the free magnetic layer 5 in a state prior to the sensing current being applied is rotated to the direction opposite to the height direction (Y2 direction in the drawing).

In this state, upon a sensing current being applied in the X1 direction in the drawing (plus side), the magnetization direction of the free magnetic layer 5 is rotated in the Y2 direction in the drawing by the sensing current magnetic field Hb. As shown in C in FIG. 16, the greater the value of the sensing current becomes, the farther away from an orthogonal state the angle between the magnetization direction of the free magnetic layer 5 and the magnetization direction of the second pinned magnetic layer 3c comes, the greater the absolute value of the output asymmetry of the magnetic detecting element becomes. In the case of this magnetic detecting element, upon a sensing current of 3 mA being applied in the X1 direction in the drawing (plus direction), the output asymmetry deteriorates to around −28%.

To this end, as shown in FIGS. 13A and 13B, adjustment is made wherein the magnetization direction of the free magnetic layer 5 in a state prior to the sensing current being applied is rotated in the height direction (Y1 direction in the drawing) by the magnetostatic field from the pinned magnetic layer 3, the magnetization direction of the free magnetic layer 5 is rotated in the Y2 direction in the drawing by the sensing current magnetic field caused by the sensing current applied in the X1 direction, and the magnetization direction of the free magnetic layer 5 is directed so as to be orthogonal to the second pinned magnetic layer 3c. Upon the pin inversion occurring in this magnetic detecting element, the output asymmetry is changed from a point A1 to a point C1 in the graph shown in FIG. 16, and the output symmetry markedly deteriorates.

The test results are shown in FIG. 17 regarding change in the standardized output of the magnetic detecting element when the direction and magnitude of a sensing current to be applied to the magnetic detecting element are changed. The horizontal axis in FIG. 17 denotes the direction and magnitude of a sensing current. The X1 direction in the drawing is taken as the plus side, and the X2 direction in the drawing is taken as the minus side.

The greater the absolute value of a sensing current becomes, the greater the standardized output of a reproducing signal becomes. However, with the magnetic detecting element in the state shown in FIG. 13 prior to the pin inversion occurring, the closer to 3 mA the value of the sensing current comes, the closer to 0 the output asymmetry comes, and with the magnetic detecting element in the state shown in FIG. 15 following the pin inversion occurring, the closer to 3 mA the value of the sensing current comes, the more the output symmetry deteriorates. Due to the difference of such output symmetry, the standardized output of the magnetic detecting element following the pin inversion occurring (C in the drawing) becomes smaller than that prior to the pin inversion occurring (A in the drawing).

SUMMARY OF THE INVENTION

Accordingly, the present invention has been made to solve the above conventional problems, and it is an object of the present invention to provide a magnetic detecting element which can maintain the output symmetry and reproduced output in a good state even when the pin inversion of a pinned magnetic layer occurs.

With the present invention, a magnetic detecting element having a multi-layer film in which a pinned magnetic layer of which the magnetization direction is pinned in the uniaxial direction and a free magnetic layer are layered with a nonmagnetic material layer, of which the both side portions are formed with a first electrode layer and a second electrode layer, situated therebetween, with a sensing current flowing in the parallel direction of the film surfaces of the pinned magnetic layer, the nonmagnetic material layer, and the free magnetic layer via these first electrode layer and second electrode layer, wherein the free magnetic layer has a layered-ferri configuration in which a first free magnetic layer and a second free magnetic layer, which are made up of a magnetic material, are layered with a nonmagnetic intermediate layer situated therebetween, and the magnetic film thickness of the second free magnetic layer in contact with the nonmagnetic material layer is greater than the magnetic film thickness of the first free magnetic layer.

The current center of a sensing current exists in a nonmagnetic material layer, the sensing current magnetic field applied to the second free magnetic layer close to the nonmagnetic material layer is smaller than that applied to the first free magnetic layer.

With the present invention, the magnetic film thickness of the second free magnetic layer in contact with the nonmagnetic material layer (product Ms×t of saturation magnetization Ms and film thickness t) is increased so as to be greater than the magnetic film thickness of the first free magnetic layer to offset the torque applied to the magnetization of the second free magnetic layer with the torque applied to the magnetization of the first free magnetic layer. The term "torque" means the cross product of magnetic film thickness and the sensing current magnetic field. With the present invention, the free magnetic layer is configured of a layered-ferri configuration, the magnetization of the first free magnetic layer and the magnetization of the second magnetic layer are configured so as be maintained in a nonparallel state by RKKY interaction via the nonmagnetic intermediate layer, so the torque applied to the second free magnetic layer and the torque applied to the first free magnetic layer are mutually offset effectively.

Accordingly, with the present invention, change in the magnetization direction of the free magnetic layer before and after a sensing current is applied to the magnetic detecting element can be suppressed.

With the present invention, the magnetization direction of the free magnetic layer faces the direction orthogonal to the magnetization direction of the pinned magnetic layer in a state before a sensing current is applied, thereby maintaining the orthogonal state between the magnetization direction of the free magnetic layer and the magnetization direction of the pinned magnetic layer even after the sensing current is applied. That is to say, with the present invention, the magnetization direction of the free magnetic layer needs not to be shifted from the direction orthogonal to the magnetization direction of the pinned magnetic layer in a state before a sensing current is applied.

Directing the magnetization direction of the free magnetic layer so as to be orthogonal to the magnetization direction of the pinned magnetic layer in a state before a sensing current is applied means that the orthogonal state between the magnetization directions of the free magnetic layer and the pinned magnetic layer is maintained even if the pin inversion for inverting the magnetization direction of the pinned magnetic layer 180 degrees. Further, even if the sensing current is applied, change in the magnetization direction of the free magnetic layer is suppressed, so even when the sensing current having the same direction as that before the pin inversion occurs is applied to the magnetic detecting element, the orthogonal state between the magnetization directions of the free magnetic layer and the pinned magnetic layer is maintained, thereby maintaining the output symmetry of the magnetic detecting element in a good state.

Also, with the present invention, even if the sensing current is applied, change in the magnetization direction of the free magnetic layer is suppressed, so even if the sensing current is applied from the first electrode layer to the second electrode layer in the magnetic detecting element wherein the pin inversion has not occurred, or is applied from the second electrode layer to the first electrode layer, the orthogonal state between the magnetization directions of the free magnetic layer and the pinned magnetic layer can be maintained, thereby maintaining the output symmetry of the magnetic detecting element in a good state.

In the event that the output symmetry of the magnetic detecting element is maintained in a good state as with the present invention, the reproduced output of the magnetic detecting element is also maintained in a good state.

With the present invention, the absolute value of the amount-of-change of output asymmetry of the magnetic detecting element when the magnetization direction of the pinned magnetic layer in contact with the nonmagnetic material layer is changed 180 degrees, may be suppressed to 20% or less and further 5% or less.

Also, with the present invention, the absolute value of the amount-of-change of the output asymmetry when the sensing current is applied from the first electrode layer to the second electrode layer and when the sensing current is applied from the second electrode layer to the first electrode layer, may be suppressed to 20% or less and further 5% or less.

Also, with the present invention, the absolute value of the amount-of-change of standardized output of the magnetic detecting element when the magnetization direction of the pinned magnetic layer in contact with the nonmagnetic material layer is changed 180 degrees, may be suppressed to 10% or less.

The absolute value of the amount-of-change of standardized output of the magnetic detecting element when the sensing current is applied from the first electrode layer to second electrode layer and when the sensing current is applied from the second electrode layer to the first electrode layer, may be suppressed to 10% or less.

With the present invention, even if the magnitude of the sensing current is around 3 to 4 mA, the absolute value of the amount-of-change of the output asymmetry when the magnetization of the pinned magnetic layer is changed 180 degrees and when the direction of the sensing current is inverted (changed 180 degrees), may be suppressed to 20% or less and further 5% or less, and also the absolute value of the amount-of-change of the standardized output may be suppressed to 10% or less.

With the present invention, the absolute value of a sensing current is preferably in a range of 2.0 mA to 4.0 mA.

Also, with the present invention, a ratio between the magnetic film thickness of the first free magnetic layer and the magnetic film thickness of the second free magnetic layer (the magnetic film thickness of the first free magnetic layer/the magnetic film thickness of the second free magnetic layer) is preferably 1/5 or more but 3/5 or less.

Further, with the present invention, if we say that the saturation magnetization of the second free magnetic layer is $Ms2$, the film thickness thereof is $t2$, the sensing current magnetic field applied to the second free magnetic layer is $Hb2$, the saturation magnetization of the first free magnetic layer is $Ms1$, the film thickness thereof is $t1$, the sensing current magnetic field applied to the first free magnetic layer is $Hb1$, and the effective value of the bias magnetic field for putting a free magnetic layer into a single magnetic domain state is $Hhb$ so as to sufficiently offset the torque applied to the second free magnetic layer with the torque applied to the first free magnetic layer when the sensing current magnetic field occurs, $|Ms2 \cdot t2 \times Hb2 - Ms1 \cdot t1 \times Hb1| \leq 0.05$ ($|(Ms2 \cdot t2 - Ms1 \cdot t1) \times Hhb|$) preferably holds. Note that $Ms2$, $Hb2$, $Ms1$, $Hb1$, and $Hhb$ represent vector values, $t1$ and $t2$ represent scalar values, [·] represents scalar product, and [×] represents vector product.

That is to say, $|Ms2 \cdot t2 \times Hb2 - Ms1 \cdot t1 \times Hb1|$ is preferably set to be small enough for the torque by the bias magnetic field, in this case, 5% or less. Note that the term "bias magnetic field" means the magnetostatic field caused by a hard bias layer, for example.

With the present invention, a protective layer made up of a nonmagnetic material is preferably formed on the first free magnetic layer. The magnetic film thickness of the first free magnetic layer varies depending on the case of the protective layer being formed on the first free magnetic layer, and the case of the protective layer not being formed. Accordingly, the magnetic film thickness of the first free magnetic layer and that of the second free magnetic layer need to be appropriately adjusted depending on whether or not the protective layer exists. This protective layer also serves as a diffusion-inhibiting layer.

With the present invention, the output symmetry and reproduced output of the magnetic detecting element may be maintained in a good state especially regarding magnetic detecting elements employing a self-pinned method wherein the magnetization direction of the pinned magnetic layer is pinned in the uniaxial direction due to the uniaxial anisotropy thereof.

With the present invention, the magnetic film thickness of the second free magnetic layer in contact with the nonmagnetic material layer (product Ms×t of saturation magnetization Ms and film thickness t) is increased so as to be greater than the magnetic film thickness of the first free magnetic layer, and offset the torque applied to the magnetization of the torque applied to the magnetization of the second free magnetic layer with the torque applied to the magnetization of the first free magnetic layer when the sensing current magnetic field occurs.

As a result of this, with the present invention, change in the magnetization direction of the free magnetic layer before and after a sensing current is applied to the magnetic detecting element can be suppressed.

With the present invention, the magnetization direction of the free magnetic layer faces the direction orthogonal to the magnetization direction of the pinned magnetic layer in a state before a sensing current is applied, thereby maintaining the orthogonal state of the magnetization direction of the free magnetic layer and that of the pinned magnetic layer even after the sensing current is applied.

Accordingly, the orthogonal state of the magnetization directions of the free magnetic layer and the pinned magnetic layer is maintained even if the pin inversion for inverting the magnetization direction of the pinned magnetic layer 180 degrees occurs, and further the orthogonal state of the magnetization directions of the free magnetic layer and the pinned magnetic layer is maintained even when the sensing current is applied, thereby maintaining the output symmetry of the magnetic detecting element in a good state. Also, with the output symmetry of the magnetic detecting element being maintained in a good state, the reproduced output of the magnetic detecting element is also maintained in a good state.

Also, the output symmetry when the sensing current is applied from the first electrode layer to the second electrode layer, and the output symmetry when the sensing current is applied from the second electrode layer to the first electrode layer are maintained in a good state, thereby increasing the freedom of designing an magnetic detecting element.

BRIEF DESCRIPTION OF THE DRAWINGS

FIG. 16 is a graph illustrating change in the output asymmetry of the magnetic detecting element shown in FIG. 12 when the direction and magnitude of a sensing current to be applied to the magnetic detecting element are changed; and FIG. 17 is a graph illustrating change in the standardized output of the magnetic detecting element shown in FIG. 12 when the direction and magnitude of a sensing current to be applied to the magnetic detecting element are changed;

DESCRIPTION OF THE PREFERRED EMBODIMENTS

First Embodiment

Figure 1:
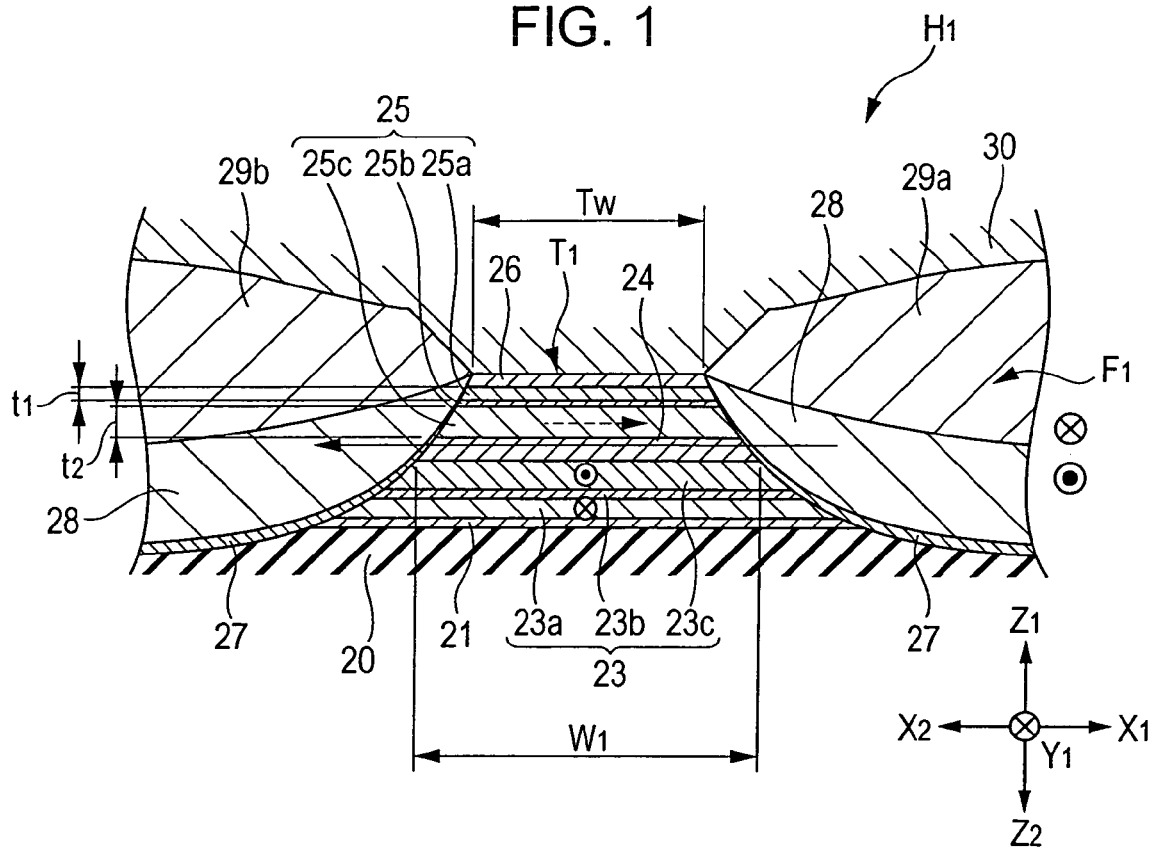
FIG. 1 is a partial cross-sectional view of a magnetic detecting element according to a first embodiment of the present invention as viewed from the facing surface side as to a recording medium.

FIG. 1 is a front view of a magnetic detecting element H1 according to a first embodiment of the present invention as view from the facing surface F1 side as to a recording medium.

The magnetic detecting element H1 shown in FIG. 1 is referred to as a single spin-valve magnetic resistance effect element, which is provided on the trailing side edge portion of a floating-type slider provided on a hard disk device or the like, detects the recording magnetic field of a hard disk or the like. Note that the moving direction of a magnetic recording medium such as a hard disk is the Z1 direction, and the direction of the leakage magnetic field from the magnetic recording medium is the Y1 direction.

With the magnetic detecting element Hi shown in FIG. 1, a first multi-layer film T1 made up of an insulating material such as alumina is formed on a lower gap layer 20.

With the embodiment shown in FIG. 1, the first multi-layer film T1 is made up of a seed layer 21, a pinned magnetic layer 23, a nonmagnetic material layer 24, a free magnetic layer 25, and a protective layer 26, which are layered in this bottom-up order. That is to say, with the embodiment shown in FIG. 1, a layer exhibiting antiferromagnetism is not layered below the pinned magnetic layer 23.

The seed layer 21 is made up of NiFe alloy, NiFeCr alloy, Cr, Ta, or the like.

The pinned magnetic layer 23 has a layered-ferri configuration wherein a first pinned magnetic layer 23a and a second pinned magnetic layer 23c are layered with a nonmagnetic intermediate layer 23 situated therebetween. The first pinned magnetic layer 23a and the second pinned magnetic layer 23c in the pinned magnetic layer 23 are adjusted so as to become positive magnetostriction. With the pinned magnetic layer 23, the magnetization is pinned in the height direction (Y1 direction in the drawing) due to the uniaxial anisotropy of itself. The first pinned magnetic layer 23a and the second pinned magnetic layer 23c are made up of a magnetic material such as NiFe alloy, Co, CoNiFe alloy, CoFe alloy, CoNi alloy, or the like. Also, the nonmagnetic intermediate layer 23b is made up of a nonmagnetic material, i.e., of Ru, Rh, Ir, Cr, Re, and Cu, one type or these two or more types of alloy. Especially, the nonmagnetic intermediate layer is preferably made up of Ru. The total film thickness of the first pinned magnetic layer 23a and the second pinned magnetic layer 23c is made up of 6 Å for example, and this total film thickness is correlated with the sum of the magnetization moment between the first pinned magnetic layer 23a and the second pinned magnetic layer 23c.

The nonmagnetic material layer 24 is a layer for preventing magnetic coupling between the pinned magnetic layer 23 and the free magnetic layer 25, and is preferably made up of a nonmagnetic material having electrical conductivity such as Cu, Cr, Au, Ag, or the like. The film thickness of the nonmagnetic material layer is 17 Å through 30 Å.

The free magnetic layer 25 has a layered-ferri configuration wherein a second free magnetic layer 25c and a first free magnetic layer 25a are layered with a nonmagnetic intermediate layer 25b situated therebetween. The second free magnetic layer 25c and the first free magnetic layer 25a are made up of a magnetic material such as NiFe alloy, Co, CoNiFe alloy, CoFe alloy, CoNi alloy, or the like. Also, the nonmagnetic intermediate layer 25b is made up of a nonmagnetic material, i.e., of Ru, Rh, Ir, Cr, Re, and Cu, one type or these two or more types of alloy. Especially, the nonmagnetic intermediate layer is preferably made up of Ru.

The protective layer 26 is made up of a layered member or the like wherein TaO is formed on TaO, Ru, and Ta, and is for preventing oxidization of the multi-layer film T1 from progressing. The film thickness of the protective layer 26 is 10 Å through 50 Å. This protective layer 26 also serves as a diffusion-inhibiting layer.

With the embodiment shown in FIG. 1, bias underlying layers 27 and 27 and hard bias layers 28 and 28 are formed on the both sides of the first multi-layer film T1 from the seed layer 21 to the protective layer 26. A first electrode layer 29a and a second electrode layer 29b are formed on the hard bias layers 28 and 28. The magnetization of the second free magnetic layer 25c of the free magnetic layer 25 is put into a single magnetic domain state in the track-width direction (X1-X2 direction in the drawing) by the vertical bias magnetic field from the hard bias layers 28 and 28.

The bias underlying layers 27 and 27 are made up of Cr, W, or Ti, the hard bias layers 28 and 28 are made up of Co—Pt (Cobalt-platinum) alloy, Co—Cr—Pt (Cobalt-Chromium-platinum) alloy, or the like, and the first electrode layer 29a and the second electrode layer 29b are made up of Cr, Ta, Rh, Au, W (Tungsten), or the like.

The film thickness of the bias underlying layers 27 and 27 is 20 Å through 100 Å, the film thickness of the hard bias layers 28 and 28 is 100 Å through 400 Å, and the film thickness of the first electrode layer 29a and the second electrode layer 29b is 400 Å through 1500 Å.

An upper gap layer 30 made up of an insulating material such as $Al_2O_3$, AlSiO, or the like is layered on the first electrode layer 29a, the second electrode layer 29b, and the protective layer 26. Note that though not shown in the drawing, a lower shield layer is provided underneath the lower gap layer 20, and an upper shield layer is provided on the upper gap layer. The lower shield layer and the upper shield layer are made up of a soft magnetic material such as NiFe or the like. The film thickness of the upper gap layer and the lower gap layer is 50 Å through 300 Å.

Electrical resistance between the first electrode layer 29a and the second electrode layer 29b varies depending on the relation between the pinned magnetization direction of the second pinned magnetic layer 23c of the pinned magnetic layer 23 and the magnetization direction of the second free magnetic layer 25c of the free magnetic layer 25 which is affected by the external magnetic field, and an external signal is reproduced from a recording medium by the voltage variation or current variation based on variation of this electrical resistance value.

The feature portions of the present embodiment will now be described.

The free magnetic layer 25 has an integrated-ferri configuration wherein the first free magnetic layer 25a and the second free magnetic layer 25c are layered with the nonmagnetic intermediate layer 25b situated therebetween, and the magnetic film thickness of the second free magnetic layer 25c in contact with the nonmagnetic material layer 24 (product Ms×t of saturation magnetization Ms and film thickness t) is increased so as to be greater than the magnetic film thickness of the first free magnetic layer 25a.

For example, the magnetic film thickness of the second free magnetic layer 25c can be increased greater than the magnetic film thickness of the first free magnetic layer 25a by forming the first free magnetic layer 25a and the second free magnetic layer 25c with the same magnetic material such as NiFe for example to increase the film thickness of the second free magnetic layer 25c greater than the film thickness of the first free magnetic layer 25a.

Note that in the event that the magnetic film thickness of the second free magnetic layer 25c is smaller than that of the first free magnetic layer 25a, the spin-flop magnetic field for directing the magnetization of the first free magnetic layer 25a and the second free magnetic layer 25c in the nonparallel direction is reduced, and the magnetization of the side edge portions of the free magnetic layer 25 is disturbed to cause reproduced output to be unstable. Accordingly, the difference between the magnetic film thickness of the second free magnetic layer 25c and that of the first free magnetic layer 25a is preferably 1.26 (T·nm) (0.1 ($memu/cm^2$)) or more.

The current center of a sensing current exists in the nonmagnetic material layer 24, and the sensing current magnetic field applied to the second free magnetic layer 25c close to the nonmagnetic material layer 24 is smaller than that applied to the first free magnetic layer 25a.

With the present invention, the magnetic film thickness of the second free magnetic layer 25c in contact with the nonmagnetic material layer 24 (product Ms×t of saturation magnetization Ms and film thickness t) is increased so as to be greater than the magnetic film thickness of the first free magnetic layer 25a to offset the torque applied to the magnetization of the second free magnetic layer 25c with the torque applied to the magnetization of the first free magnetic layer 25a. The term "torque" means the cross product of magnetic film thickness and the sensing current magnetic field. With the present invention, the free magnetic layer 25 is configured of a layered-ferri configuration, the magnetization of the first free magnetic layer 25a and the magnetization of the second magnetic layer 25c are configured so as be maintained in a nonparallel state by the RKKY interaction via the nonmagnetic intermediate layer, so the torque applied to the second free magnetic layer 25c and the torque applied to the first free magnetic layer 25a are effectively offset.

With the present invention, if we say that the saturation magnetization of the second free magnetic layer 25c is Ms2, the film thickness thereof is t2, the sensing current magnetic field applied to the second free magnetic layer 25c is Hb2, the saturation magnetization of the first free magnetic layer 25a is Ms1, the film thickness thereof is t1, the sensing current magnetic field applied to the first free magnetic layer 25a is Hb1, and the effective value of the bias magnetic field for putting a free magnetic layer into a single magnetic domain state is Hhb so as to sufficiently offset the torque applied to the second free magnetic layer 25c with the torque applied to the first free magnetic layer 25a when the sensing current magnetic field occurs, $|Ms2 \cdot t2 \times Hb2 - Ms1 \cdot t1 \times Hb1| \leq 0.05$ ($|(Ms2 \cdot t2 - Ms1 \cdot t1) \times Hhb|$) preferably holds. Note that Ms2, Hb2, Ms1, Hb1, and Hhb represent vector values, t1 and t2 represent scalar values, [·] represents scalar product, and [×] represents vector product.

That is to say, $|Ms2 \cdot t2 \times Hb2 - Ms1 \cdot t1 \times Hb1|$ is preferably set to be small enough for the torque by the bias magnetic field, in this case, preferably 5% or less. Note that the term "bias magnetic field" means the magnetostatic field caused by a hard bias layer, for example.

According to simulation, for example, when the center distance between the nonmagnetic material layer 24 and the second magnetic layer 25c is 20 Å, and the center distance between the nonmagnetic material layer 24 and the first magnetic layer 25a is 50 Å, the sensing current magnetic field applied to the first free magnetic layer 25a is around 1.75 times as strong as that applied to the second free magnetic layer 25c. For example, when the magnitude of a sensing current is 4 mA, the sensing current magnetic field applied to the first free magnetic layer 25a is 11.2 kA/m, and that applied to the second free magnetic layer 25c is 6.4 kA/m.

For instance, when the center distance between the nonmagnetic material layer 24 and the second magnetic layer 25c is 20 Å, the center distance between the nonmagnetic material layer 24 and the first magnetic layer 25a is 50 Å, and the second free magnetic layer 25c and the first free magnetic layer 25a are made up of the same material, upon the film thickness of the second free magnetic layer 25c being adjusted 1.75 times as thick as the film thickness of the first free magnetic layer 25a, the torque applied to the magnetization of the second magnetic layer 25c is generally completely offset with the torque applied to the magnetization of the first free magnetic layer 25a.

Actually, it is preferable that the center distance between the nonmagnetic material layer 24 and the second magnetic layer 25c is set to 20 Å through 50 Å, the center distance between the nonmagnetic material layer 24 and the first magnetic layer 25a is set to 40 Å through 75 Å, and the ratio of the magnetic film thickness between the first free magnetic layer 25a and the second free magnetic layer 25c (the magnetic film thickness of the first free magnetic layer 25a /the magnetic film thickness of the second free magnetic layer 25c) is set to a range between 1/5 through 3/5.

With the present embodiment, when the sensing current magnetic field occurs, the torque applied to the magnetization of the second free magnetic layer 25c is effectively mutually offset with the torque applied to the magnetization of the first free magnetic layer 25a.

As a result of this, with the present invention, change in the magnetization direction of the free magnetic layer 25 before and after a sensing current is applied to the magnetic detecting element can be suppressed.

Actually, the first free magnetic layer is readily diffused, and the magnetic film thickness of the first free magnetic layer is readily affected by diffusion. Also, the current center of a sensing current is changed depending on the film thickness, the ratio of the magnetic film thickness between the first free magnetic layer 25a and the second free magnetic layer 25c (first free magnetic layer 25a /second free magnetic layer 25c) is preferably adjusted in a range between 1/5 and 3/5 as appropriate to mutually offset the torque applied to the magnetization of the second free magnetic layer 25c with the torque applied to the magnetization of the first free magnetic layer 25a effectively.

Figure 2:
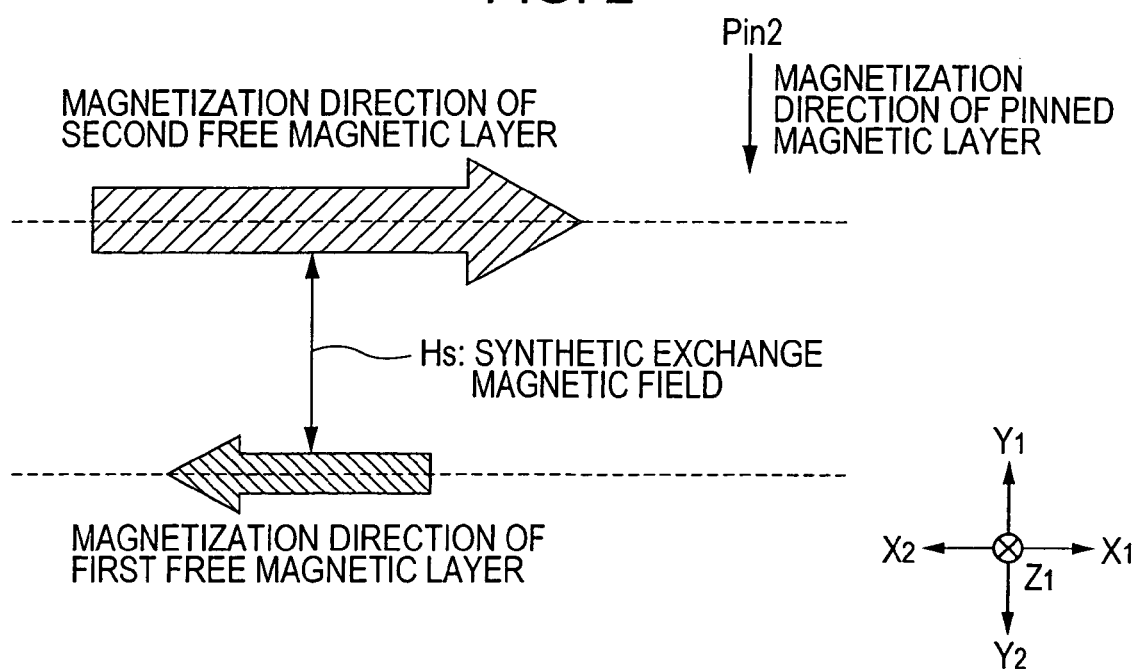
FIG. 2 is a schematic diagram illustrating the magnetization of a free magnetic layer.

With the present invention, the magnetization direction of the free magnetic layer 25 faces the direction orthogonal to the magnetization direction of the pinned magnetic layer in a state before a sensing current is applied, thereby maintaining the orthogonal state between the magnetization direction of the free magnetic layer 25 and the magnetization direction of the pinned magnetic layer even after the sensing current is applied. That is to say, in a state wherein the external magnetic field is not applied, the magnetization directions of the second free magnetic layer 25c and the first free magnetic layer 25a are directed to the direction orthogonal to the magnetization direction of the second pinned magnetic layer 23c, as shown in FIG. 2.

Directing the magnetization direction of the free magnetic layer 25 so as to be orthogonal to the magnetization direction of the pinned magnetic layer 23 in a state before a sensing current is applied means that the orthogonal state between the magnetization directions of the free magnetic layer 25 and the pinned magnetic layer 23 is maintained even if the pin inversion for inverting the magnetization direction of the pinned magnetic layer 23 180 degrees. Further, even if the sensing current is applied, change in the magnetization direction of the free magnetic layer 25 is suppressed, so even when the sensing current having the same direction as that before the pin inversion occurs is applied to the magnetic detecting element, the orthogonal state between the magnetization directions of the free magnetic layer 25 and the pinned magnetic layer 23 is maintained, thereby maintaining the output symmetry of the magnetic detecting element in a good state. Also, upon the output symmetry of the magnetic detecting element being maintained in a good state, the reproduced output of the magnetic detecting element is also maintained in a good state.

Also, with the present invention, even if the sensing current is applied, change in the magnetization direction of the free magnetic layer 25 is suppressed, so even if the sensing current is applied from the first electrode layer 29a to the second electrode layer 29b in the magnetic detecting element wherein the pin inversion has not occurred, or is applied from the second electrode layer 29b to the first electrode layer 29a, the orthogonal state between the magnetization directions of the free magnetic layer 25 and the pinned magnetic layer 23 can be maintained, thereby maintaining the output symmetry of the magnetic detecting element in a good state.

With the present invention, the absolute value of the amount-of-change of output asymmetry of the magnetic detecting element when the magnetization direction of the pinned magnetic layer 23 in contact with the nonmagnetic material layer 24 is changed 180 degrees, may be suppressed to 20% or less and further 5% or less.

With the present invention, the absolute value of the amount-of-change of standardized output of the magnetic detecting element when the magnetization direction of the pinned magnetic layer 23 in contact with the nonmagnetic material layer 24 is changed 180 degrees, may be suppressed to 10% or less.

Note that the absolute value of the amount-of-change of the output asymmetry when the sensing current is applied from the first electrode layer 29a to second electrode layer 29b and when the sensing current is applied from the second electrode layer 29b to the first electrode layer 29a, may be suppressed to 20% or less and further 5% or less.

Also, the absolute value of the amount-of-change of standardized output of the magnetic detecting element when the sensing current is applied from the first electrode layer 29a to second electrode layer 29b and when the sensing current is applied from the second electrode layer 29b to the first electrode layer 29a, may be suppressed to 10% or less.

Even if the magnitude of the sensing current is around 3 through 4 mA, the absolute value of the amount-of-change of the output asymmetry when the magnetization of the pinned magnetic layer is changed 180 degrees and when the direction of the sensing current is inverted (changed 180 degrees), may be suppressed to 5% or less, and also the absolute value of the amount-of-change of the standardized output may be suppressed to 10% or less. The absolute value of the sensing current is preferably in a range of 2.0 mA to 4.0 mA.

With the present invention, the protective layer 26 made up of a nonmagnetic material is preferably formed on the first free magnetic layer 25a. The magnetic film thickness of the first free magnetic layer 25a varies depending on the case of the protective layer 26 being formed on the first free magnetic layer 25a, and the case of the protective layer 26 not being formed. Accordingly, the magnetic film thickness of the first free magnetic layer 25a and that of the second free magnetic layer 25c need to be appropriately adjusted depending on whether or not the protective layer 26 exists.

As with the present embodiment, with the magnetic detecting elements employing a self-pinned method wherein the magnetization direction of the pinned magnetic layer 23 is pinned in the uniaxial direction due to the uniaxial anisotropy thereof, the pin inversion for inverting the magnetization direction of a pinned magnetic layer 180 degrees readily occurs. However, even if the pin inversion occurs, it is possible for the magnetic detecting element according to the present embodiment to maintain the orthogonal state between the free magnetic layer 25 and the pinned magnetic layer 23, and maintain the output symmetry and reproduced output of the magnetic detecting element in a good state.

Second Embodiment

Figure 3:
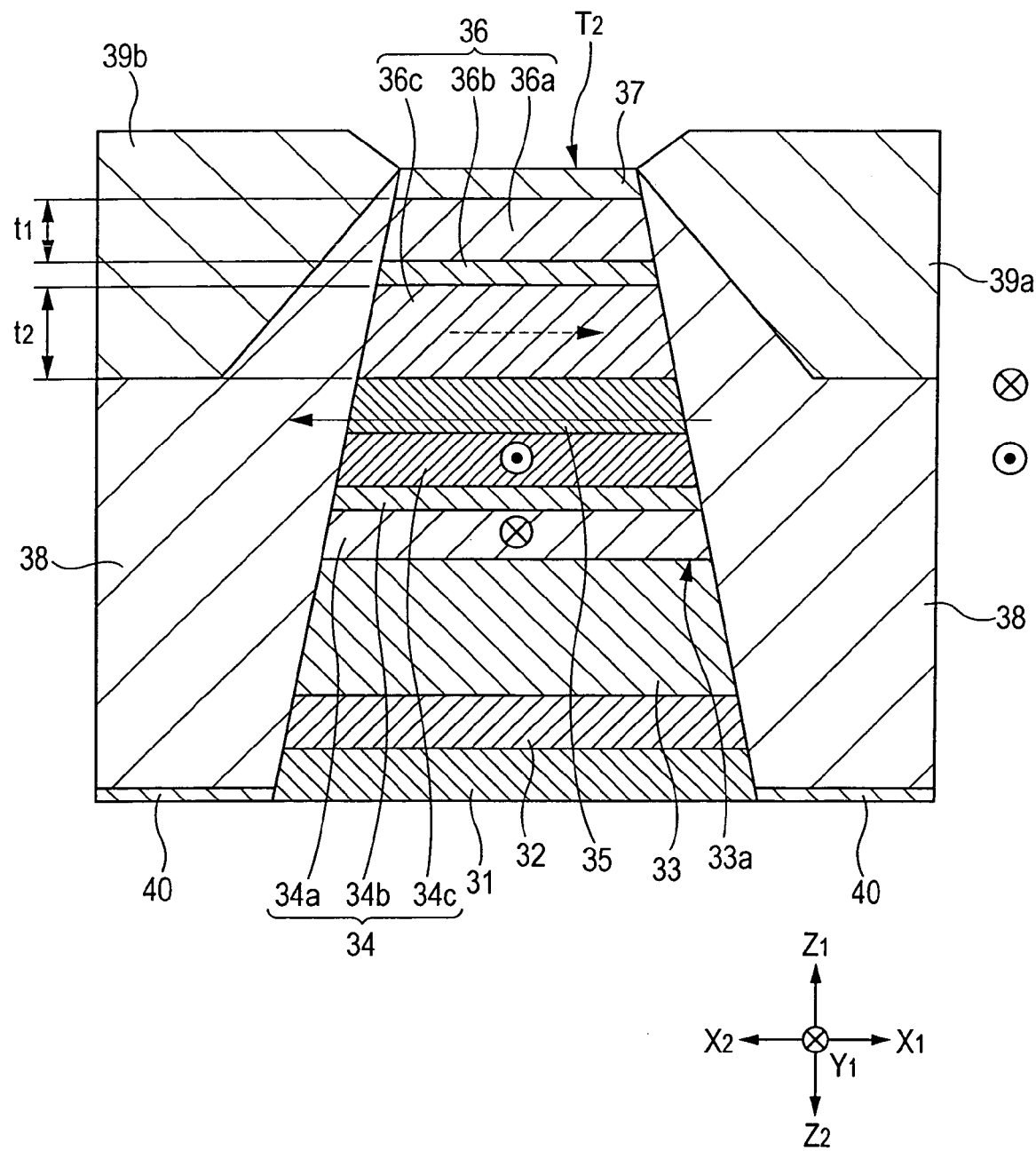
FIG. 3 is a partial cross-sectional view of a magnetic detecting element according to a second embodiment of the present invention as viewed from the facing surface side as to a recording medium.

FIG. 3 is a partial cross-sectional view of a magnetic detecting element according to a second embodiment of the present invention as viewed from the facing surface side as to a recoding medium. Note that in FIG. 3, only the center portion of the element which extends in the track-width direction (the X direction and the direction opposite to the X direction in the drawing) is shown in a breaking manner.

The magnetic detecting element shown in FIG. 3 is different from the magnetic detecting element shown in FIG. 1 in that the magnetization direction of a first pinned magnetic layer 34a of a pinned magnetic layer 34 is pinned in the Y1 direction in the drawing by the exchange coupling magnetic field between the first pinned magnetic layer 34a and an antiferromagnetic layer 33.

The undermost layer formed in FIG. 3 is an underlying layer 31 made up of a nonmagnetic material such as one type or two or more types of element, of Ta, Hf, Nb, Zr, Ti, Mo, and W. Note that formation of the underlying layer 31 is not indispensable.

A seed layer 32 is formed above the underlying layer 31. The grain diameter in the direction parallel to the film surface of each layer, which is formed above the seed layer 32, can be enlarged by forming the seed layer 32, thereby realizing improvement of electricity reliability represented by improvement of electromigration resistance, improvement of magnetoresistive rate ($\Delta R/R$), and the like, more appropriately.

The seed layer 32 is made up of NiFeCr alloy, NiCr alloy, Cr, or the like. The antiferromagnetic layer 33 formed above the seed layer 32 is preferably made up of an antiferromagnetic material including elements X (however, X is one type or two or more types of element, of Pt, Pd, Ir, Rh, Ru, and Os) and Mn.

X—Mn alloy employing these elements of the platinum group is excellent in corrosion resistance, has a high blocking temperature, and further has excellent properties as an antiferromagnetic material such as being capable of increasing the exchange coupling magnetic field (Hex). Of the elements of the platinum group, especially Pt or Ir is preferably employed. For example, PtMn alloy or IrMn alloy, which are made up of a binary linage, can be employed.

Also, with the present invention, the antiferromagnetic layer 33 may be made up of an antiferromagnetic material including element X, element X' (however, element X' is one type or two or more types of element, of Ne, Ar, Kr, Xe, Be, B, C, N, Mg, Al, Si, P, Ti, V, Cr, Fe, Co, Ni, Cu, Zn, Ga, Ge, Zr, Nb, Mo, Ag, Cd, Sn, Hf, Ta, W, Re, Au, Pb, and a rare earth element), and Mn.

The pinned magnetic layer 34 formed above the antiferromagnetic layer 33 is configured of a first pinned magnetic layer 34a in contact with an interface 33a of the antiferromagnetic layer 33, and a second pinned magnetic layer 34c formed on the first pinned magnetic layer 34a across a nonmagnetic intermediate layer 34b, as a layered ferri-pinned configuration. The first pinned magnetic layer 34a and the second pinned magnetic layer 34c are made up of a magnetic material such as NiFe alloy, Co, CoNiFe alloy, CoFe alloy, CoNi alloy, or the like. Also, the nonmagnetic intermediate layer 34b, which is made up of a nonmagnetic material, is made up, of Ru, Rh, Ir, Cr, Re, and Cu, one type or these two or more types of alloy. Especially, this is preferably made up of Ru. The total film thickness of the first pinned magnetic layer 34a and the second pinned magnetic layer 34c is 6 Å, which is correlated with the sum of magnetic moment between the first pinned magnetic layer 34a and the second pinned magnetic layer 34c.

A nonmagnetic material layer 35 is formed above the pinned magnetic layer 34. The nonmagnetic material layer 35 is made up of Cu, for example. The film thickness of the nonmagnetic material is 17 Å through 30 Å.

A free magnetic layer 36 has an integrated-ferri configuration wherein a second free magnetic layer 36c and a first free magnetic layer 36a are layered with a nonmagnetic intermediate layer 36b. The second free magnetic layer 36c and the first free magnetic layer 36a are made up of a magnetic material such as NiFe alloy, Co, CoNiFe alloy, CoFe alloy, CoNi alloy, or the like. Also, the nonmagnetic intermediate layer 36b, which is made up of a nonmagnetic material, is made up of, of Ru, Rh, Ir, Cr, Re, and Cu, one type or these two or more types of alloy, and particularly preferably is made up of Ru.

A protective layer 37 is made up of an integrated member wherein TaO is formed on TaO, Ru, and Ta, and is for preventing oxidization of a multi-layer film T2 from progressing. The film thickness of the protective layer 37 is 10 Å through 50 Å. The protective layer 37 also serves as a diffusion-inhibiting layer.

With the embodiment shown in FIG. 3, bias underlying layers 40 and 40, hard bias layers 38 and 38, and electrode layers 39 and 39 are formed on the both sides of the multi-layer film T2 from the underlying layer 31 to the protective layer 37. The magnetization of the second free magnetic layer 36c of the free magnetic layer 36 is put into a single magnetic domain state in the track-width direction (X1-X2 direction in the drawing) by the vertical bias magnetic field from the hard bias layers 38 and 38.

The bias underlying layers 40 and 40 are made up of Cr, W, or Ti, the hard bias layers 38 and 38 are made up of Co—Pt (Cobalt-platinum) alloy, Co—Cr—Pt (Cobalt-Chromium-platinum) alloy, or the like, and the first electrode layer 39a and the second electrode layer 39b are made up of Cr, Ta, Rh, Au, W (Tungsten), or the like.

The film thickness of the bias underlying layers 40 and 40 is 20 Å through 100 Å, the film thickness of the hard bias layers 38 and 38 is 100 Å through 400 Å, and the film thickness of the first electrode layer 39a and the second electrode layer 39b is 400 Å through 1500 Å.

An upper gap layer made up of an insulating material such as $Al_2O_3$, AlSiO, or the like is layered on the first electrode layer 39a, the second electrode layer 39b, and the protective layer 37, though not shown in the drawing. Note that though not shown in the drawing, a lower shield layer is provided underneath the lower gap layer, and an upper shield layer is provided on the upper gap layer. The lower shield layer and the upper shield layer are made up of a soft magnetic material such as NiFe or the like. The film thickness of the upper gap layer and the lower gap layer is 50 Å through 300 Å.

Electrical resistance between the first electrode layer 39a and the second electrode layer 39b varies depending on the relation between the pinned magnetization direction of the second pinned magnetic layer 34c of the pinned magnetic layer 34 and the magnetization direction of the second free magnetic layer 36c of the free magnetic layer 36 which is affected by the external magnetic field, and an external signal is reproduced from a recording medium by the voltage variation or current variation based on variation of this electrical resistance value.

The feature portions of the present embodiment will now be described.

The free magnetic layer 36 has an integrated-ferri configuration wherein the first free magnetic layer 36a and the second free magnetic layer 36c are layered with the nonmagnetic intermediate layer 36b situated therebetween, and the magnetic film thickness of the second free magnetic layer 36c in contact with the nonmagnetic material layer 35 (product Ms×t of saturation magnetization Ms and film thickness t) is increased so as to be greater than the magnetic film thickness of the first free magnetic layer 36a.

For example, the magnetic film thickness of the second free magnetic layer 36c can be increased greater than the magnetic film thickness of the first free magnetic layer 36a by forming the first free magnetic layer 36a and the second free magnetic layer 36c with the same magnetic material such as NiFe for example to increase the film thickness of the second free magnetic layer 36c greater than the film thickness of the first free magnetic layer 36a.

The current center of a sensing current exists in the nonmagnetic material layer 35, and the sensing current magnetic field applied to the second free magnetic layer 36c close to the nonmagnetic material layer 35 is smaller than that applied to the first free magnetic layer 36a.

With the present invention, the magnetic film thickness of the second free magnetic layer 36c in contact with the nonmagnetic material layer 35 (product Ms×t of saturation magnetization Ms and film thickness t) is increased so as to be greater than the magnetic film thickness of the first free magnetic layer 36a to offset the torque applied to the magnetization of the second free magnetic layer 36c with that applied to the magnetization of the first free magnetic layer 36a. The term "torque" means the cross product of magnetic film thickness and the sensing current magnetic field. With the present invention, the free magnetic layer 36 is configured of a layered-ferri configuration, the magnetization of the first free magnetic layer 36a and the magnetization of the second magnetic layer 36c are configured so as be maintained in a non-parallel state by the RKKY interaction via the nonmagnetic intermediate layer, so the torque applied to the second free magnetic layer 36c and the torque applied to the first free magnetic layer 36a are effectively mutually offset.

With the present invention, if we say that the saturation magnetization of the second free magnetic layer 36c is Ms2, the film thickness thereof is t2, the sensing current magnetic field applied to the second free magnetic layer 36c is Hb2, the saturation magnetization of the first free magnetic layer 36a is Ms1, the film thickness thereof is t1, the sensing current magnetic field applied to the first free magnetic layer 36a is Hb1, and the effective value of the bias magnetic field for putting a free magnetic layer into a single magnetic domain state is Hhb so as to sufficiently offset the torque applied to the second free magnetic layer 36c with the torque applied to the first free magnetic layer 36a when the sensing current magnetic field occurs, $|Ms2 \cdot t2 \times Hb2 - Ms1 \cdot t1 \times Hb1| \leq 0.05$ $(|(Ms2 \cdot t2 - Ms1 \cdot t1) \times Hhb|)$ preferably holds. Note that Ms2, Hb2, Ms1, Hb1, and Hhb represent vector values, t1 and t2 represent scalar values, [·] represents scalar product, and [×] represents vector product.

That is to say, $|Ms2 \cdot t2 \times Hb2 - Ms1 \cdot t1 \times Hb1|$ is preferably set to be small enough for the torque by the bias magnetic field, in this case, preferably 5% or less. Note that the term "bias magnetic field" means the magnetostatic field caused by a hard bias layer, for example.

For instance, when the center distance between the nonmagnetic material layer 35 and the second magnetic layer 36c is 20 Å, the center distance between the nonmagnetic material layer 35 and the first magnetic layer 36a is 50 Å, and the second free magnetic layer 36c and the first free magnetic layer 36a are made up of the same material, upon the film thickness of the second free magnetic layer 36c being adjusted 1.75 times as thick as the film thickness of the first free magnetic layer 36a, the torque applied to the magnetization of the second magnetic layer 36c is generally completely offset with the torque applied to the magnetization of the first free magnetic layer 36a.

Actually, it is preferable that the center distance between the nonmagnetic material layer 35 and the second magnetic layer 36c is set to 20 Å through 50 Å, the center distance between the nonmagnetic material layer 35 and the first magnetic layer 36a is set to 40 Å through 75 Å, and the ratio of the magnetic film thickness between the first free magnetic layer 36a and the second free magnetic layer 36c (the magnetic film thickness of the first free magnetic layer 36a /that of the second free magnetic layer 36c) is set to a range between 1/5 through 3/5.

With the present embodiment, when the sensing current magnetic field occurs, the torque applied to the magnetization of the second free magnetic layer 36c is effectively mutually offset with the torque applied to the magnetization of the first free magnetic layer 36a.

As a result of this, with the present invention, change in the magnetization direction of the free magnetic layer 36 before and after a sensing current is applied to the magnetic detecting element can be suppressed.

Accordingly, in a state wherein the external magnetic field is not applied, the magnetization directions of the second free magnetic layer 36c and the first free magnetic layer 36a are directed to the direction orthogonal to the magnetization direction of the second pinned magnetic layer 34c even before and after a sensing current is applied, as shown in FIG. 2.

Consequently, even when a sensing current having the same direction as that before the pin inversion occurs is applied to the magnetic detecting element wherein the pin inversion occurred, the orthogonal state between the magnetization directions of the free magnetic layer 36 and the pinned magnetic layer 34 is maintained, thereby maintaining the output symmetry of the magnetic detecting element in a good state. Also, upon the output symmetry of the magnetic detecting element being maintained in a good state, the reproduced output of the magnetic detecting element is also maintained in a good state.

With the present invention, the absolute value of the amount-of-change of output asymmetry of the magnetic detecting element when the magnetization direction of the pinned magnetic layer 34 in contact with the nonmagnetic material layer 35 is changed 180 degrees, may be suppressed to 20% or less and further 5% or less.

Also, the absolute value of the amount-of-change of output asymmetry when the sensing current is applied from the first electrode layer 39a to second electrode layer 39b and when the sensing current is applied from the second electrode layer 39b to the first electrode layer 39a, may be suppressed to 20% or less and further 5% or less.

Also, with the present invention, the absolute value of the amount-of-change of standardized output of the magnetic detecting element when the magnetization direction of the pinned magnetic layer 34 in contact with the nonmagnetic material layer 35 is changed 180 degrees, may be suppressed to 10% or less.

Further, the absolute value of the amount-of-change of standardized output of the magnetic detecting element when the sensing current is applied from the first electrode layer 39a to second electrode layer 39b and when the sensing current is applied from the second electrode layer 39b to the first electrode layer 39a, may be suppressed to 10% or less.

Note that the absolute value of the sensing current is preferably in a range of 2.0 mA to 4.0 mA.

With the present invention, the protective layer 37 made up of a nonmagnetic material is formed on the first free magnetic layer 36a. The magnetic film thickness of the first free magnetic layer 36a varies depending on the case of the protective layer 37 being formed on the first free magnetic layer 36a, and the case of the protective layer 37 not being formed. Accordingly, the magnetic film thickness of the first free magnetic layer 36a and that of the second free magnetic layer 36c need to be appropriately adjusted depending on whether or not the protective layer 37 exists.

Even if the pin inversion is caused by electrostatic discharge which occurs during a manufacturing process, it is possible for the magnetic detecting element according to the present embodiment to maintain the orthogonal state between the free magnetic layer 36 and the pinned magnetic layer 34, and maintain the output symmetry and reproduced output of the magnetic detecting element in a good state.

FIRST EXAMPLE

Figure 4:
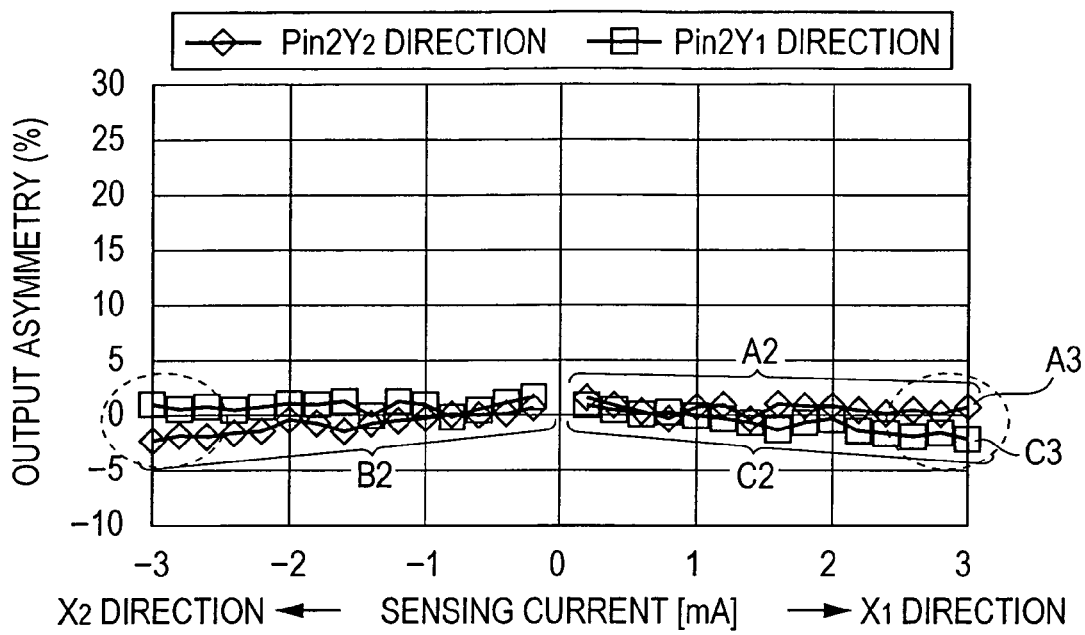
FIG. 4 is a graph illustrating change in the output asymmetry of the magnetic detecting element shown in FIG. 1 when the direction and magnitude of a sensing current to be applied to the magnetic detecting element are changed.

The test results are shown in FIG. 4 regarding change in the output asymmetry of the magnetic detecting element when the direction and magnitude of a sensing current to be applied to the magnetic detecting element shown in FIG. 1 are changed. The horizontal axis in FIG. 4 denotes the direction and magnitude of a sensing current. The X1 direction in the drawing is taken as the plus side, and the X2 direction in the drawing is taken as the minus side.

Even if the sensing current magnetic field which occurs when a sensing current is applied in the X1 direction in the drawing (plus side), or the sensing current magnetic field which occurs when a sensing current is applied in the X2 direction in the drawing (minus side) is applied to the free magnetic layer 25, the magnetization direction of the free magnetic layer 25 seldom varies, and the state wherein the second free magnetic layer 25c faces the X1 direction in the drawing, and the first free magnetic layer 25a faces the X2 direction in the drawing is maintained. With the magnetic detecting element shown in FIG. 1, the angle between the magnetization directions of the second free magnetic layer 25c and the second pinned magnetic layer 23c is adjusted so as to become 90 degrees.

A2 and B2 in FIG. 4 (indicated by a ◇) denote change in the output asymmetry of the magnetic detecting element when the magnetization direction of the second pinned magnetic layer 23c (Pin2) faces the direction opposite to the Y1 direction in FIG. 1 (Y2 direction). As shown in A2 and B2 in FIG. 4, even if the absolute value of the sensing current becomes greater, the output asymmetry of the magnetic detecting element is maintained in almost 0%. This is because the magnetization direction of the second free magnetic layer 25c continues to face the X1 direction in the drawing even if the value of the sensing current becomes greater, and consequently, the angle between the magnetization directions of the second free magnetic layer 25c and the second pinned magnetic layer 23c continues to maintain a state of almost 90 degrees. In the case of this magnetic detecting element, even if the sensing current is applied 3 mA in the X1 direction in the drawing (plus direction), the output asymmetry is around 0%, and even if the sensing current is applied 3 mA in the X2 direction in the drawing (minus direction), the output asymmetry is around −2%.

Now, let us say that the pin inversion for inverting the magnetization direction of the pinned magnetic layer 23 180 degrees occurs, and the magnetization direction of the second pinned magnetic layer 23c (Pin2) faces the Y1 direction in the drawing. As described above, the angle between the magnetization directions of the second free magnetic layer 25c and the second pinned magnetic layer 23c is adjusted so as to become 90 degrees, so even if the pin inversion occurs, the relative angle between the magnetization directions of the second free magnetic layer 25c and the second pinned magnetic layer 23c is still maintained at 90 degrees. Further, even if the sensing current magnetic field which occurs when a sensing current is applied in the X1 direction in the drawing (plus side), or the sensing current magnetic field which occurs when a sensing current is applied in the X2 direction in the drawing (minus side) is applied to the free magnetic layer 25, the magnetization direction of the free magnetic layer 25 seldom varies, and the state wherein the second free magnetic layer 25c faces the X1 direction in the drawing, and the first free magnetic layer 25a faces the X2 direction in the drawing is maintained. Accordingly, as shown in C2 in FIG. 4 (indicated by □), even if the sensing current is applied in the X1 direction in the drawing (plus side) into the magnetic detecting element wherein the pin inversion occurred, the output asymmetry stays at almost 0%. On the other hand, even if the sensing current is applied in the X2 direction (minus side), the output asymmetry stays at almost 0%.

For example, when the pin inversion occurs in the magnetic detecting element wherein a sensing current of 3 mA is applied in the X1 direction (plus direction), the output asymmetry results in alternately traversing between the point A3

(output asymmetry is 0%) and the point C4 (output asymmetry is −2%), and accordingly, the output symmetry never deteriorates markedly.

Thus, the absolute value of the amount-of-change of output asymmetry of the magnetic detecting element may be suppressed to 20% or less and further 5% or less.

Figure 5:
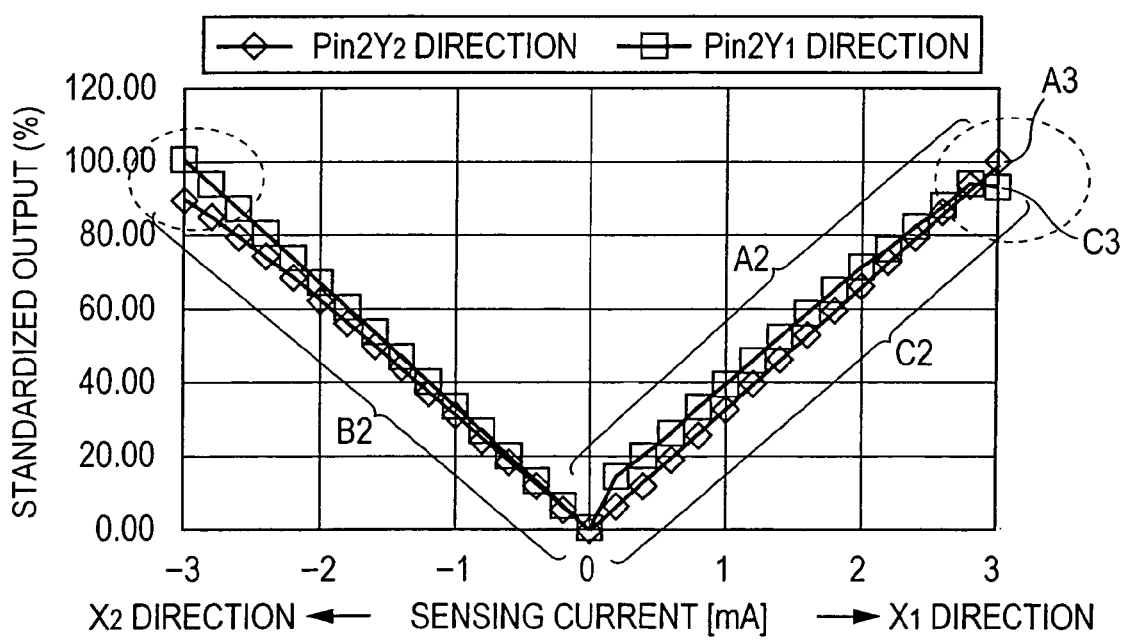
FIG. 5 is a graph illustrating change in the standardized output of the magnetic detecting element shown in FIG. 1 when the direction and magnitude of a sensing current to be applied to the magnetic detecting element are changed.

Next, the test results are shown in FIG. 5 regarding change in the standardized output of the magnetic detecting element when the direction and magnitude of a sensing current to be applied to the magnetic detecting element shown in FIG. 1 are changed. The horizontal axis in FIG. 5 denotes the direction and magnitude of a sensing current. The X1 direction in the drawing is taken as the plus side, and the X2 direction in the drawing is taken as the minus side.

The greater the absolute value of a sensing current becomes, the greater the standardized output of a reproduced signal becomes. The magnetic detecting element according to the embodiment of the present invention shown in FIG. 1 maintains the output asymmetry in a state of almost 0% even if the pin inversion occurs, so the difference between the standardized output of the magnetic detecting element after the pin inversion occurs (C3 in the drawing) and the standardized output of the magnetic detecting element before the pin inversion occurs (A3 in the drawing) is suppressed to 5% or so.

Thus, the absolute value of the amount-of-change of standardized output of the magnetic detecting element may be suppressed to 10% or less.

SECOND EXAMPLE

With regard to three types of magnetic detecting elements which have the same layered configuration as the magnetic detecting element shown in FIG. 1, but have a different ratio between the magnetic film thickness of the first free magnetic layer and that of the second free magnetic layer (the magnetic film thickness of the first free magnetic layer/the magnetic film thickness of the second magnetic layer), we have tested the direction and magnitude of a sensing current, and change in the output symmetry and standardized output of the magnetic detecting elements.

Figure 6:
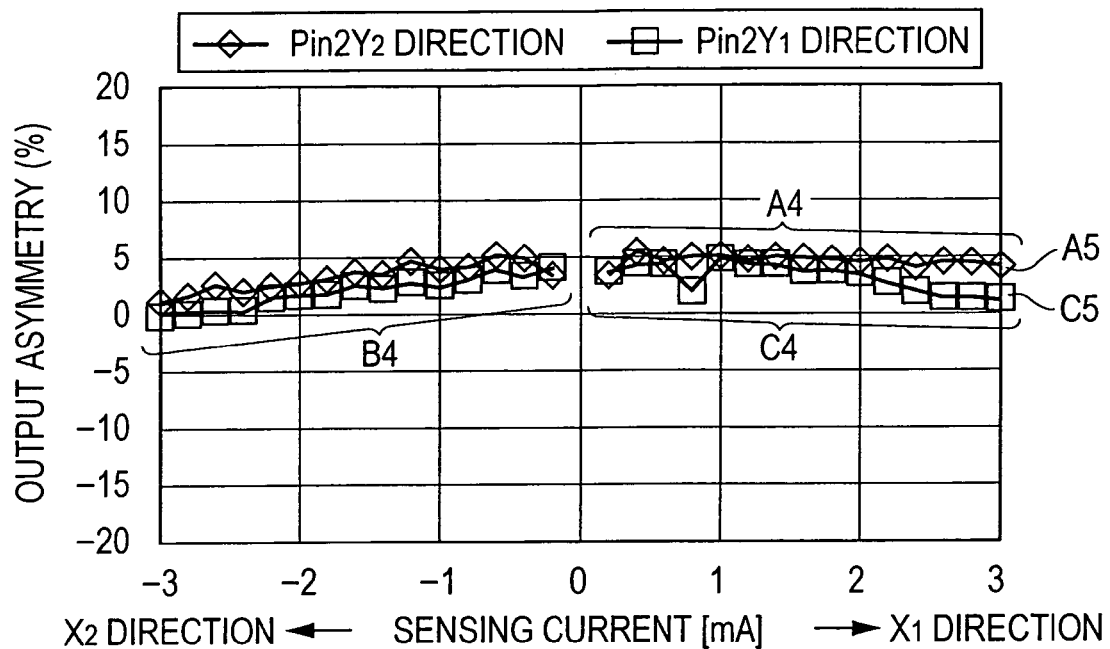
FIG. 6 is a graph illustrating change in the output asymmetry of the magnetic detecting element when the direction and magnitude of a sensing current to be applied to the magnetic detecting element wherein the magnetic film thickness of the first free magnetic layer/the magnetic film thickness of the second magnetic layer is 1/5 or more but 3/5 or less are changed.

FIG. 6 is a graph illustrating the test results regarding the magnetic detecting element wherein the magnetic film thickness of the first free magnetic layer is 1.93 T·nm, the magnetic film thickness of the second free magnetic layer is 4.19 T·nm, and the magnetic film thickness of the first free magnetic layer/the magnetic film thickness of the second magnetic layer is 0.46. The horizontal axis in FIG. 6 denotes the direction and magnitude of the sensing current. The X1 direction in the drawing is taken as the plus side, and the X2 direction in the drawing is taken as the minus side.

The magnetic detecting element according to the Example of which the magnetic film thickness of the first free magnetic layer/the magnetic film thickness of the second magnetic layer is 0.46, i.e., is in a range of 1/5 or more but 3/5 or less exhibits the same results as those in FIG. 4.

That is to say, even if the value of the sensing current becomes greater, the angle between the magnetization directions of the second free magnetic layer 25c and the second pinned magnetic layer 23c continues to keep a state of almost 90 degrees. In the case of this magnetic detecting element, when the magnetization direction of the second pinned magnetic layer 23c (Pin2) faces the Y2 direction in the drawing, the output asymmetry is 4% even if the sensing current is applied 3 mA in the X1 direction in the drawing (plus direction), and the output asymmetry is 0% even if the sensing current is applied 3 mA in the X2 direction in the drawing (minus direction).

Here, even if the pin inversion for inverting the magnetization direction of the pinned magnetic layer 23 occurs, a sensing current is applied in the X1 direction in the drawing (plus side) into the magnetic detecting element of which the magnetization direction of the second pinned magnetic layer 23c (Pin2) faces the Y1 direction in the drawing, the output asymmetry stays at almost 0%. Also, even if the sensing current is applied in the X2 direction in the drawing (minus side), the output asymmetry stays at almost 0%.

For example, when the pin inversion occurs in the magnetic detecting element wherein a sensing current of 3 mA is applied in the X1 direction (plus direction), the output asymmetry results in alternately traversing between the point A5 (output asymmetry is 4%) and the point C5 (output asymmetry is 0%), and accordingly, the output symmetry never markedly deteriorates.

Figure 7:
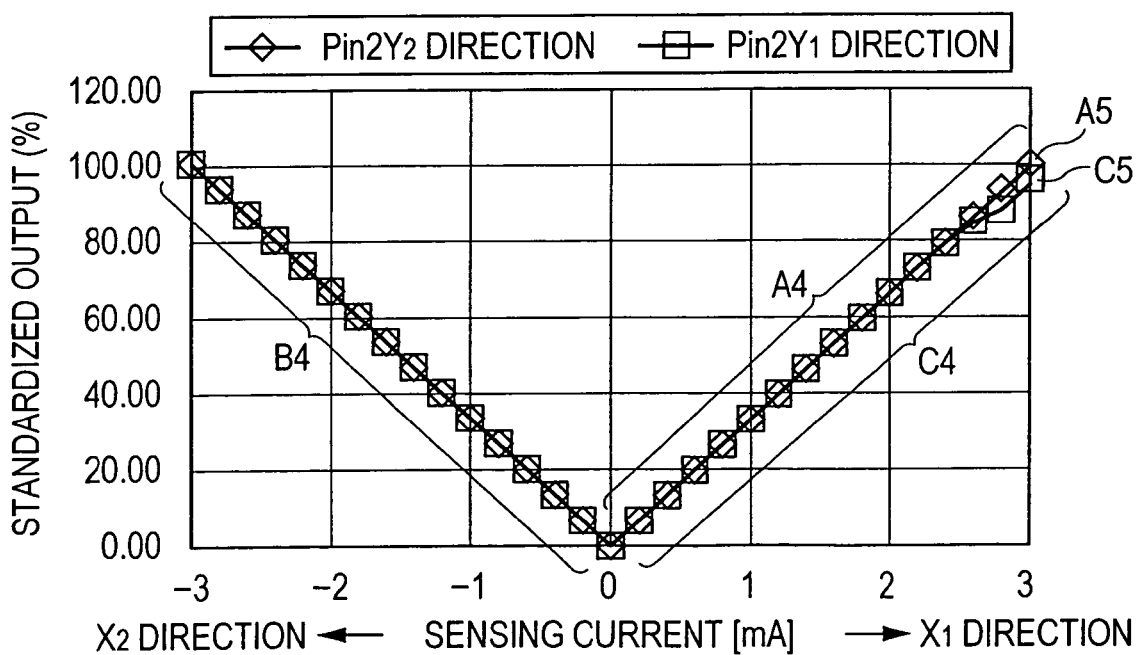
FIG. 7 is a graph illustrating change in the standardized output the magnetic detecting element when the direction and magnitude of a sensing current to be applied to the magnetic detecting element wherein the magnetic film thickness of the first free magnetic layer/the magnetic film thickness of the second magnetic layer is 1/5 or more but 3/5 or less are changed.

Next, the test results are shown in FIG. 7 regarding change in the standardized output of the magnetic detecting element wherein the magnetic film thickness of the first free magnetic layer is 1.93 T·nm, the magnetic film thickness of the second free magnetic layer is 4.19 T·nm, and the magnetic film thickness of the first free magnetic layer/the magnetic film thickness of the second magnetic layer is 0.46. The horizontal axis in FIG. 7 denotes the direction and magnitude of the sensing current. The X1 direction in the drawing is taken as the plus side, and the X2 direction in the drawing is taken as the minus side.

The greater the absolute value of a sensing current becomes, the greater the standardized output of a reproduced signal becomes. The magnetic detecting element according to the present Example maintains the output asymmetry in a state of almost 0% even if the pin inversion occurs, so the difference between the standardized output of the magnetic detecting element after the pin inversion occurs (C5 in the drawing) and the standardized output of the magnetic detecting element before the pin inversion occurs (A4 in the drawing) is suppressed to 5% or so.

Figure 8:
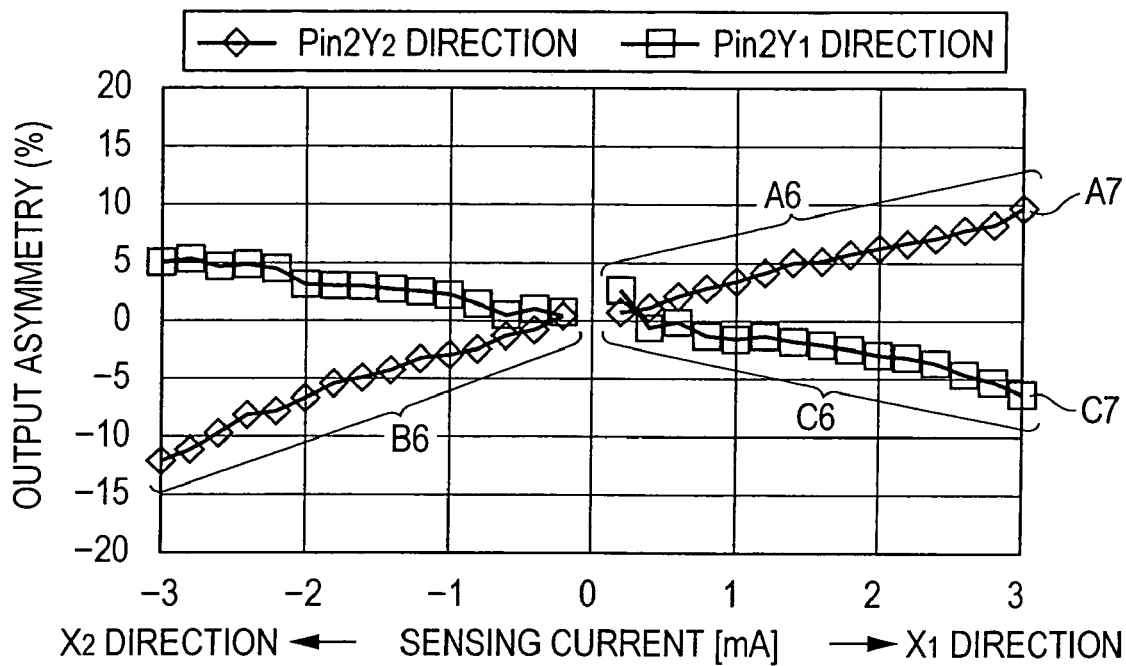
FIG. 8 is a graph illustrating change in the output asymmetry of the magnetic detecting element when the direction and magnitude of a sensing current to be applied to the magnetic detecting element wherein the magnetic film thickness of the first free magnetic layer/the magnetic film thickness of the second magnetic layer is 1/5 or less are changed.
Figure 9:
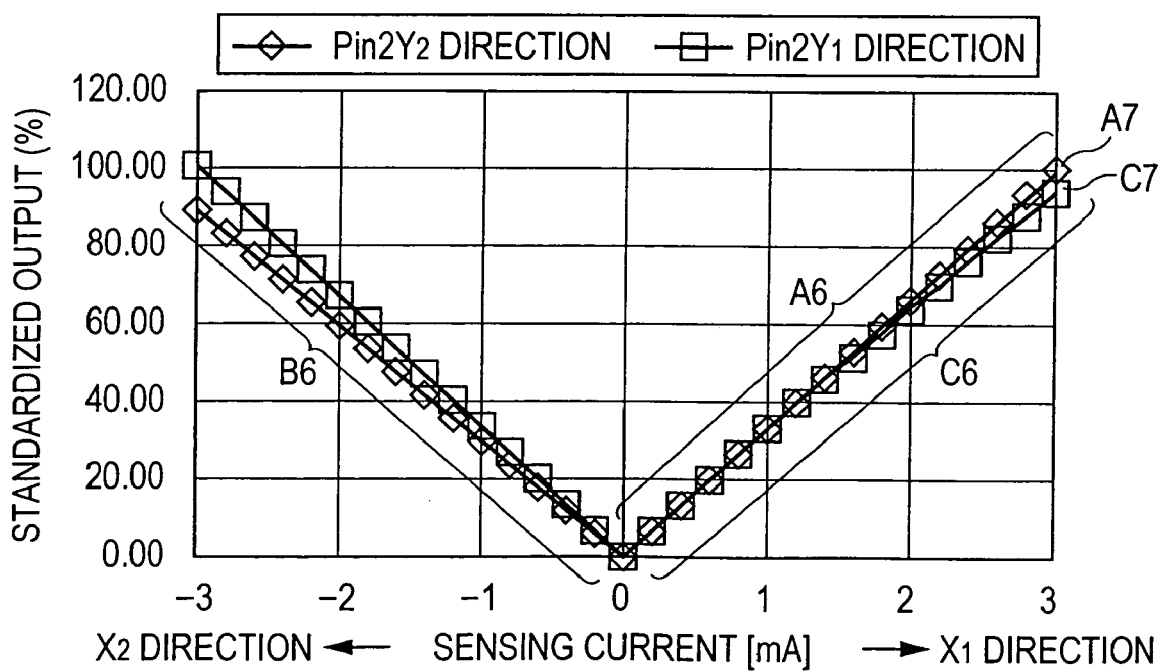
FIG. 9 is a graph illustrating change in the standardized output of the magnetic detecting element when the direction and magnitude of a sensing current to be applied to the magnetic detecting element wherein the magnetic film thickness of the first free magnetic layer/the magnetic film thickness of the second magnetic layer is 1/5 or less are changed.

FIG. 8 is a graph illustrating the relation between the sensing current and the output asymmetry regarding the magnetic detecting element wherein the magnetic film thickness of the first free magnetic layer is 0.71 T·nm, the magnetic film thickness of the second free magnetic layer is 4.19 T·nm, and the magnetic film thickness of the first free magnetic layer/the magnetic film thickness of the second magnetic layer is 0.17. FIG. 9 illustrates the test results regarding change in the standardized output of the magnetic detecting element when the direction and magnitude of the sensing current to be applied to the magnetic detecting element are changed. The horizontal axes in FIGS. 8 and 9 denote the direction and magnitude of the sensing current. The X1 direction in the drawing is taken as the plus side, and the X2 direction in the drawing is taken as the minus side.

The magnetic detecting element of which the magnetic film thickness of the first free magnetic layer/the magnetic film thickness of the second magnetic layer is 0.17, i.e., is smaller than 1/5 cannot sufficiently offset the torque applied to the second free magnetic layer 25c with the torque applied to the first free magnetic layer 25a.

Consequently, when the magnetization direction of the second pinned magnetic layer 23c (Pin2) faces the Y2 direction in the drawing, upon a sensing current of 3 mA being applied in the X1 direction in the drawing (plus direction), the output asymmetry becomes 10%, or upon a sensing current of 3 mA being applied in the X2 direction in the drawing (minus direction), the output asymmetry becomes −12%.

Here, upon the pin inversion for inverting the magnetization direction of the pinned magnetic layer 23 occurring, and the magnetization direction of the second pinned magnetic layer 23c (Pin2) facing the Y1 direction in the drawing, the output asymmetry when a sensing current is applied 3 mA in the X1 direction in the drawing (plus side) becomes −6%, or the output asymmetry when a sensing current is applied 3 mA in the X2 direction in the drawing (minus side) becomes −6%.

Also, when the pin inversion occurs in the magnetic detecting element wherein a sensing current of 3 mA is applied in the X1 direction (plus direction), the output asymmetry results in alternately traversing between the point A7 (output asymmetry is 10%) and the point C7 (output asymmetry is −6%).

The direction of the sensing current of the standardized output of the magnetic detecting element shown in FIG. 9, and the amount-of-change due to the pin inversion are somewhat greater than the amount-of-change of the standardized output of the magnetic detecting element shown in FIG. 7.

The tendencies shown in the graphs of FIGS. 8 and 9 are similar to the graphs of the conventional example shown in FIGS. 16 and 17, but the amount-of-change of the output asymmetry and the amount-of-change of the standardized output are smaller than the results of the conventional magnetic detecting element.

Figure 10:
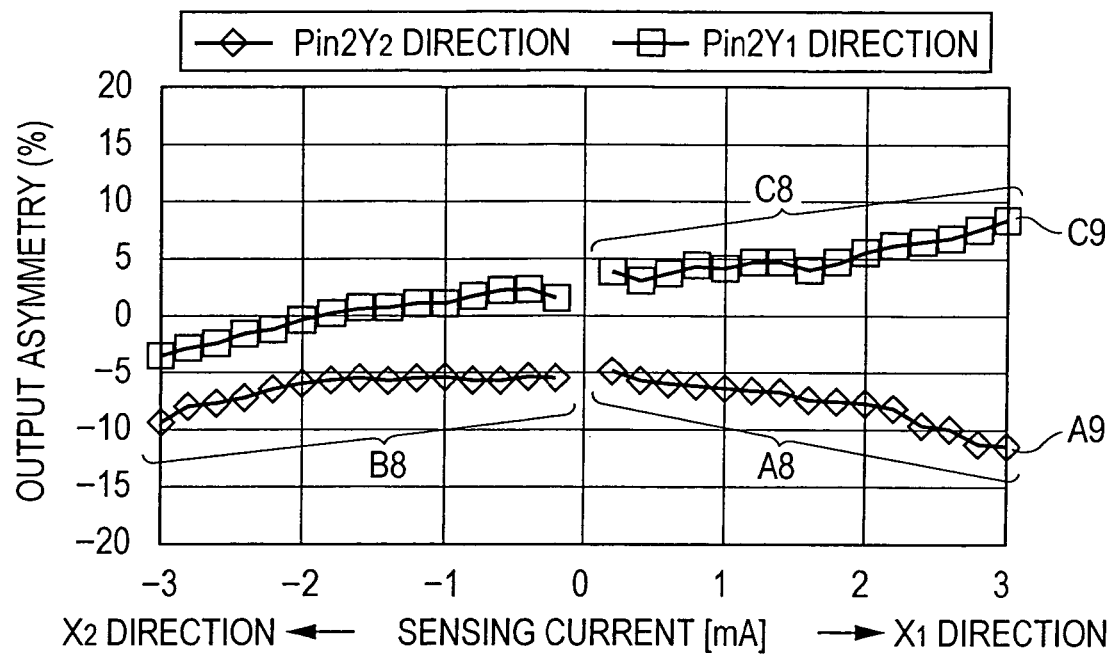
FIG. 10 is a graph illustrating change in the output asymmetry of the magnetic detecting element when the direction and magnitude of a sensing current to be applied to the magnetic detecting element wherein the magnetic film thickness of the first free magnetic layer/the magnetic film thickness of the second magnetic layer is greater than 3/5 are changed.
Figure 11:
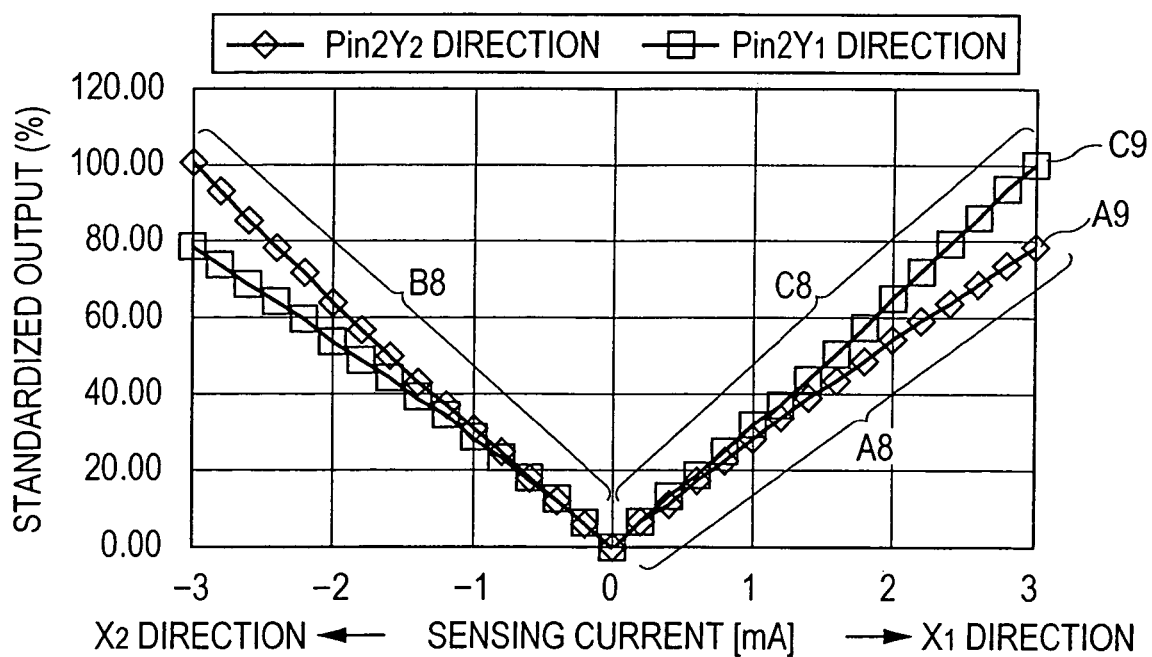
FIG. 11 is a graph illustrating change in the standardized output of the magnetic detecting element when the direction and magnitude of a sensing current to be applied to the magnetic detecting element wherein the magnetic film thickness of the first free magnetic layer/the magnetic film thickness of the second magnetic layer is greater than 3/5 are changed.
Figure 12:
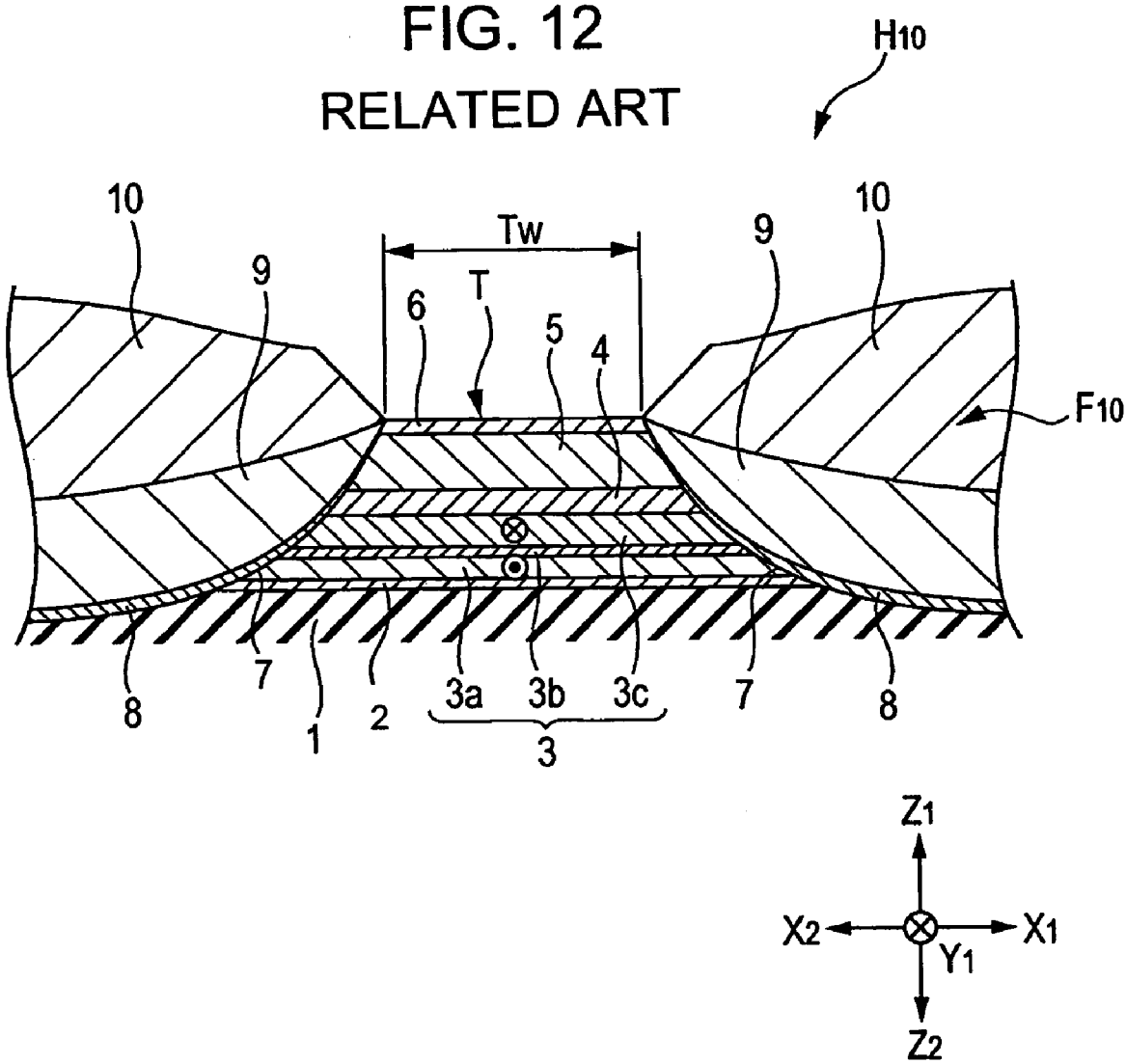
FIG. 12 is a partial cross-sectional view of a conventional magnetic detecting element as viewed from the facing surface side as to a recording medium.
Figure 13B:
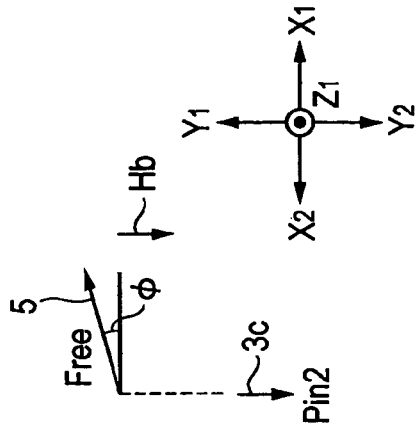
FIG. 13B is a schematic diagram illustrating the magnetization direction of the free magnetic layer 5 and the magnetization direction of the pinned magnetic layer 3c before a sensing current is applied as viewed from the upper side of FIG. 13A.
Figure 14B:
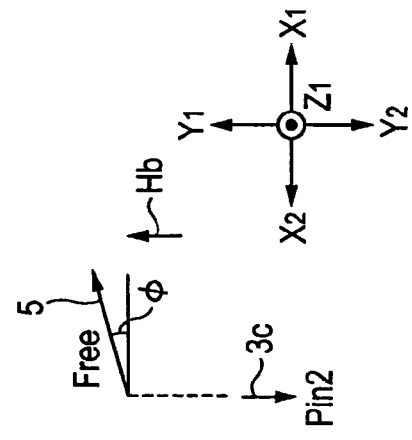
FIG. 14B is a schematic diagram illustrating the magnetization direction of the free magnetic layer 5 and the magnetization direction of the pinned magnetic layer 3c before a sensing current is applied as viewed from the upper side of FIG. 14A.
Figure 13A:
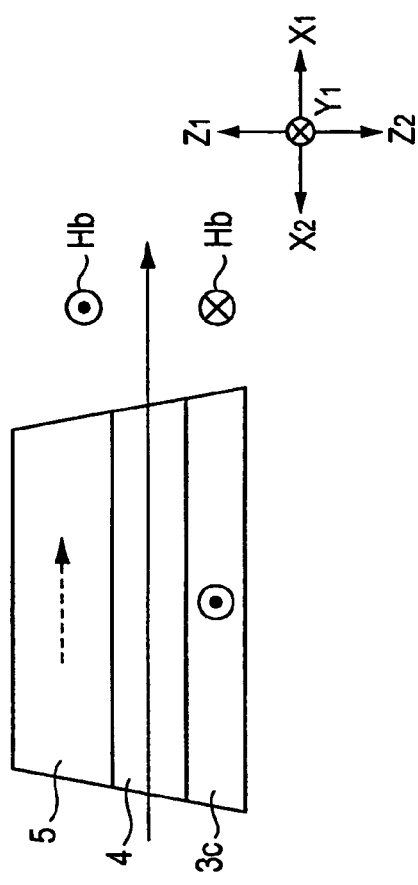
FIG. 13A is a partial cross-sectional view of the free magnetic layer 5, nonmagnetic material layer 4, and second pinned magnetic layer 3c of the magnetic detecting element shown in FIG. 12.
Figure 14A:
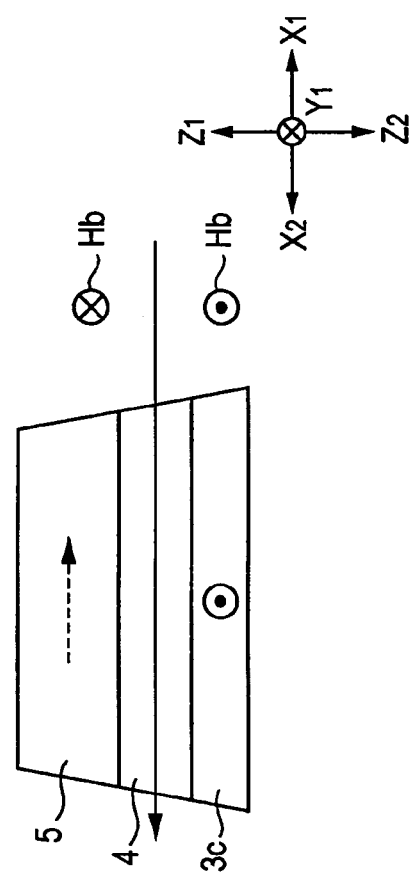
FIG. 14A is a partial cross-sectional view of the free magnetic layer 5, nonmagnetic material layer 4, and second pinned magnetic layer 3c of the magnetic detecting element shown in FIG. 12.
Figure 15B:
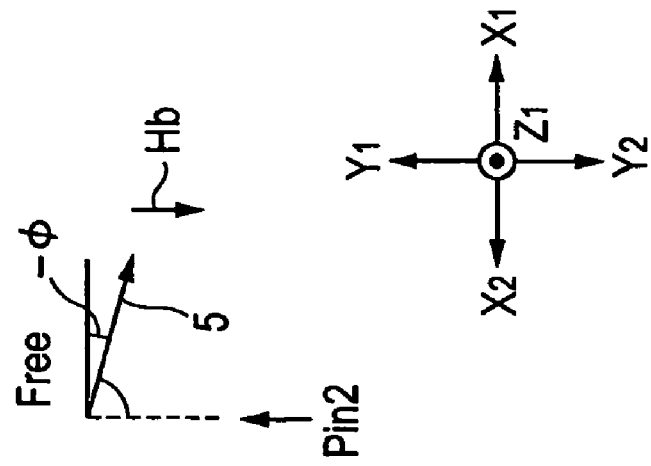
FIG. 15B is a schematic diagram illustrating the magnetization direction of the free magnetic layer 5 and the magnetization direction of the pinned magnetic layer 3c before a sensing current is applied as viewed from the upper side of FIG. 15A.
Figure 15A:
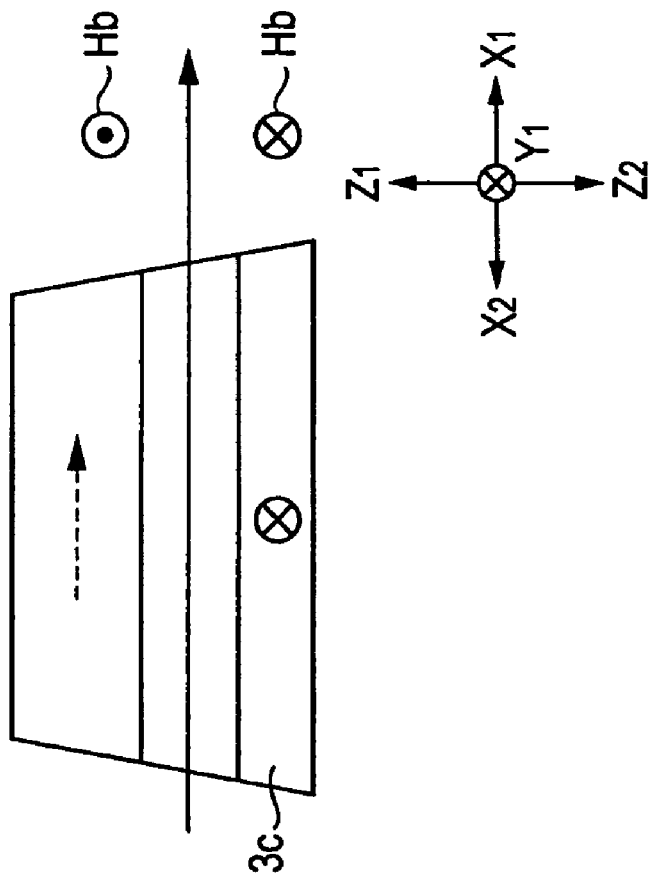
FIG. 15A is a partial cross-sectional view of the free magnetic layer 5, nonmagnetic material layer 4, and second pinned magnetic layer 3c of the magnetic detecting element which causes pin inversion.

FIG. 10 is a graph illustrating the relation between the sensing current and the output asymmetry regarding the magnetic detecting element wherein the magnetic film thickness of the first free magnetic layer is 2.78 T·nm, the magnetic film thickness of the second free magnetic layer is 4.19 T·nm, and the magnetic film thickness of the first free magnetic layer/the magnetic film thickness of the second magnetic layer is 0.66. FIG. 11 illustrates the test results regarding change in the standardized output of the magnetic detecting element when the direction and magnitude of the sensing current to be applied to the magnetic detecting element are changed. The horizontal axes in FIGS. 10 and 11 denote the direction and magnitude of the sensing current. The X1 direction in the drawing is taken as the plus side, and the X2 direction in the drawing is taken as the minus side.

With the magnetic detecting element of which the magnetic film thickness of the first free magnetic layer/the magnetic film thickness of the second magnetic layer is 0.66, i.e., is greater than 3/5, the torque applied to the magnetization of the first free magnetic layer 25a becomes greater.

In FIG. 10, when the magnetization direction of the second pinned magnetic layer 23c (Pin2) faces the Y2 direction in the drawing, upon a sensing current of 3 mA being applied in the X1 direction in the drawing (plus direction), the output asymmetry becomes −11%, or upon a sensing current of 3 mA being applied in the X2 direction in the drawing (minus direction), the output asymmetry becomes −10%.

Here, upon the pin inversion for inverting the magnetization direction of the pinned magnetic layer 23 occurring, and the magnetization direction of the second pinned magnetic layer 23c (Pin2) facing the Y1 direction in the drawing, the output asymmetry when a sensing current is applied 3 mA in the X1 direction in the drawing (plus side) becomes 9%, or the output asymmetry when a sensing current is applied 3 mA in the X2 direction in the drawing (minus side) becomes −4%.

Also, when the pin inversion occurs in the magnetic detecting element wherein a sensing current of 3 mA is applied in the X1 direction (plus direction), the output asymmetry results in alternately traversing between the point A9 (output asymmetry is −11%) and the point C9 (output asymmetry is 4%).

The maximum amount-of-change due to the direction of the sensing current of standardized output of the magnetic detecting element in a range of the sensing current shown in FIG. 11, and the pin inversion is 20%.

From the results shown in FIGS. 6 through 11, it can be understood that the ratio between the magnetic film thickness of the first free magnetic layer and the magnetic film thickness of the second free magnetic layer of the magnetic detecting element according to the present invention is preferably in a range of 1/5 or more but 3/5 or less.

What is claimed is:

1. A magnetic detecting element having a multi-layer film comprising:

a lower gap layer made up of an insulating material, a seed layer formed on the lower gap layer, a pinned magnetic layer formed directly on the seed layer, a nonmagnetic material layer formed on the pinned magnetic layer, a free magnetic layer formed on the nonmagnetic material layer, and a protective layer formed on the free magnetic layer, wherein the pinned magnetic layer has a layered-ferri configuration including a first pinned magnetic layer and a second pinned magnetic layer which are made up of a magnetic material and layered with a first nonmagnetic intermediate layer situated therebetween, the first pinned magnetic layer and the second pinned magnetic layer have positive magnetostriction, and the magnetization direction of each of the first and second pinned magnetic layers is pinned in a uniaxial direction by its uniaxial anisotropy, and first and second electrode layers are formed on both sides of the multi-layer film so that a sensing current flows in a direction parallel to the film surfaces of the pinned magnetic layer, the nonmagnetic material layer, and the free magnetic layer via the first and second electrode layers, wherein the free magnetic layer has a layered-ferri configuration in which a first free magnetic layer and a second free magnetic layer, which comprise a magnetic material, are layered with a second nonmagnetic intermediate layer situated therebetween, and a magnetic film thickness of the second free magnetic layer in contact with the nonmagnetic material layer is greater than a magnetic film thickness of the first free magnetic layer, wherein a ratio between the magnetic film thickness of the first free magnetic layer and the magnetic film thickness of the second free magnetic layer (the magnetic film thickness of the first free magnetic layer/the magnetic film thickness of the second free magnetic layer) is between 1/5 and 3/5 inclusive.

2. The magnetic detecting element according to claim 1, wherein an absolute value of an amount-of-change of output asymmetry of the magnetic detecting element when the magnetization direction of the pinned magnetic layer in contact with the nonmagnetic material layer is changed 180 degrees, is 20% or less.

3. The magnetic detecting element according to claim 2, wherein the absolute value of the amount-of-change of output asymmetry of the magnetic detecting element when the magnetization direction of the pinned magnetic layer in contact with the nonmagnetic material layer is changed 180 degrees, is 5% or less.

4. The magnetic detecting element according to claim 1, wherein an absolute value of an amount-of-change of output asymmetry when the sensing current is applied from the first electrode layer to second electrode layer and when the sensing current is applied from the second electrode layer to the first electrode layer, is 20% or less.

5. The magnetic detecting element according to claim 4, wherein the absolute value of the amount-of-change of output asymmetry when the sensing current is applied from the first electrode layer to second electrode layer and when the sensing current is applied from the second electrode layer to the first electrode layer, is 5% or less.

6. The magnetic detecting element according to claim 1, wherein an absolute value of an amount-of-change of standardized output of the magnetic detecting element when the magnetization direction of the pinned magnetic layer in contact with the nonmagnetic material layer is changed 180 degrees, is 10% or less.

7. The magnetic detecting element according to claim 1, wherein an absolute value of an amount-of-change of standardized output of the magnetic detecting element when the sensing current is applied from the first electrode layer to second electrode layer and when the sensing current is applied from the second electrode layer to the first electrode layer, is 10% or less.

8. The magnetic detecting element according to claim 1, wherein the following equation is satisfied:

$$|Ms2 \cdot t2 \times Hb2 - Ms1 \cdot t1 \times Hb1| \leqq 0.05(|(Ms2 \cdot t2 - Ms1 \cdot t1)| \times Hhb),$$

where $Ms2$ is a saturation magnetization of the second free magnetic layer, $t2$ is the magnetic film thickness of the second free magnetic layer, $Hb2$ is a sensing current magnetic field applied to the second free magnetic layer, $Ms1$ is a saturation magnetization of the first free magnetic layer, $t1$ is the magnetic film thickness of the first free magnetic layer, $Hb1$ is a sensing current magnetic field applied to the first free magnetic layer, $Hhb$ is an effective value of a bias magnetic field for putting the free magnetic layer into a single-magnetic-domain state, wherein $Ms2$, $Hb2$, $Ms1$, $Hb1$, and $Hhb$ represent vector values, $t1$ and $t2$ represent scalar values, "·" represents a scalar product, and "x" represents a vector product.

9. The magnetic detecting element according to claim 1, wherein the seed layer material comprises at least one of: NiFe alloy, a NiFeCr alloy, Cr and Ta.

10. The magnetic detecting element according to claim 1, wherein the first nonmagnetic intermediate layer comprises at least one of: Ru, Rh, Ir, Cr, and Re.

11. The magnetic detecting element according to claim 1, wherein the second nonmagnetic intermediate layer comprises at least one of: Ru, Rh, Ir, Cr, and Re.

12. The magnetic detecting element according to claim 1, wherein the protective layer comprises at least one of: TaO, Ru, and a layered member including Ta and TaO formed thereon.

* * * * *